United States Patent [19]
Sasaki et al.

[11] Patent Number: 5,978,305
[45] Date of Patent: Nov. 2, 1999

[54] SEMICONDUCTOR INTEGRATED CIRCUIT DEVICE

[75] Inventors: Toshio Sasaki, Muzuho-machi; Yuji Tanaka; Kazumasa Yanagisawa, both of Kokubunji; Hitoshi Tanaka, Ome; Jun Sato, Musashino; Takashi Miyamoto, Tokyo; Mariko Ohtsuka, Kokubunji; Satoru Nakanishi, Fuchu; Kazushige Ayukawa, Kokubunji; Takao Watanabe, Fuchu, all of Japan

[73] Assignees: Hitachi, Ltd.; Hitachi ULSI Systems Co., Ltd., both of Tokyo, Japan

[21] Appl. No.: 09/165,194

[22] Filed: Oct. 2, 1998

[30] Foreign Application Priority Data

Oct. 2, 1997 [JP] Japan ..................... 9-286118

[51] Int. Cl.[6] ................................................. G11C 7/00
[52] U.S. Cl. ................... 365/230.03; 365/230.06
[58] Field of Search .............. 365/230.03, 230.02, 365/230.06, 200

[56] References Cited

U.S. PATENT DOCUMENTS

| | | | |
|---|---|---|---|
| 5,371,711 | 12/1994 | Nakayama | 365/230.03 |
| 5,572,479 | 11/1996 | Satou | 365/230.06 |
| 5,598,372 | 1/1997 | Matsumoto et al. | 365/230.01 |
| 5,701,270 | 12/1997 | Mohan Rao | 365/230.03 |
| 5,818,784 | 10/1998 | Muranaka et al. | 365/230.03 |

FOREIGN PATENT DOCUMENTS

| | | |
|---|---|---|
| 2-83895 | 3/1990 | Japan . |
| 4-313886 | 11/1992 | Japan . |
| 9-106684 | 4/1997 | Japan . |
| 9-245474 | 9/1997 | Japan . |

*Primary Examiner*—David Nelms
*Assistant Examiner*—Anh Phung
*Attorney, Agent, or Firm*—Antonelli, Terry, Stout & Kraus, LLP

[57] ABSTRACT

A RAM mounted so as to mix with logic circuits has a plurality of memory mats and one control circuit provided for the plurality of memory mats. Arithmetic circuits for respectively performing +1 or −1 arithmetic operations are respectively provided so as to correspond to the respective memory mats and are electrically connected in cascade form. An input terminal of the initial-stage arithmetic circuit is supplied with address-setting fixed address signals. Input signals supplied to the next and subsequent arithmetic circuits or signals outputted therefrom are defined as own-assigned address signals (those assigned to the corresponding memory mats). A comparator provided in association with each arithmetic circuit referred to above makes comparisons for coincidence between the address signals and address signals input upon memory access. The corresponding memory mat is selected based on the resultant coincidence signal.

26 Claims, 14 Drawing Sheets

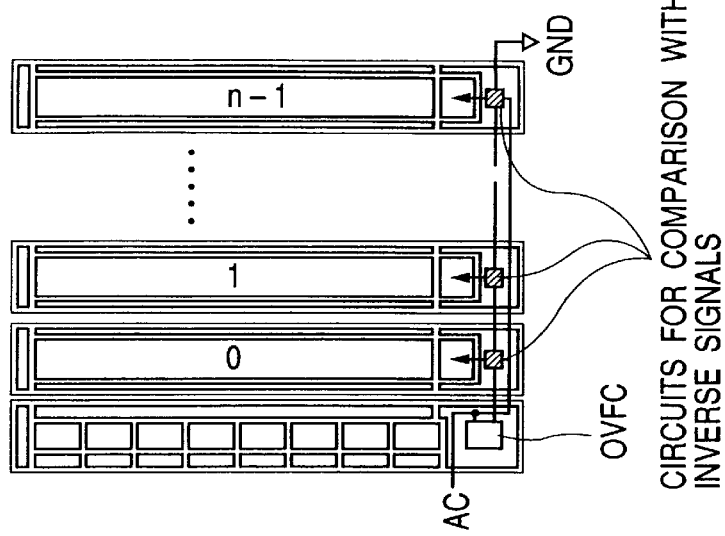
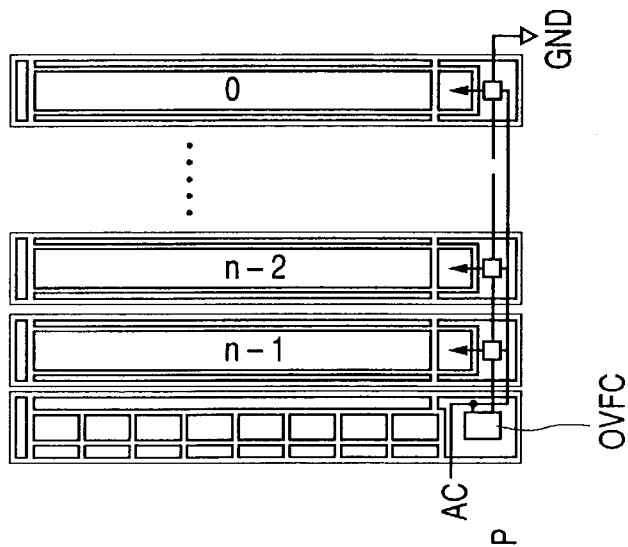
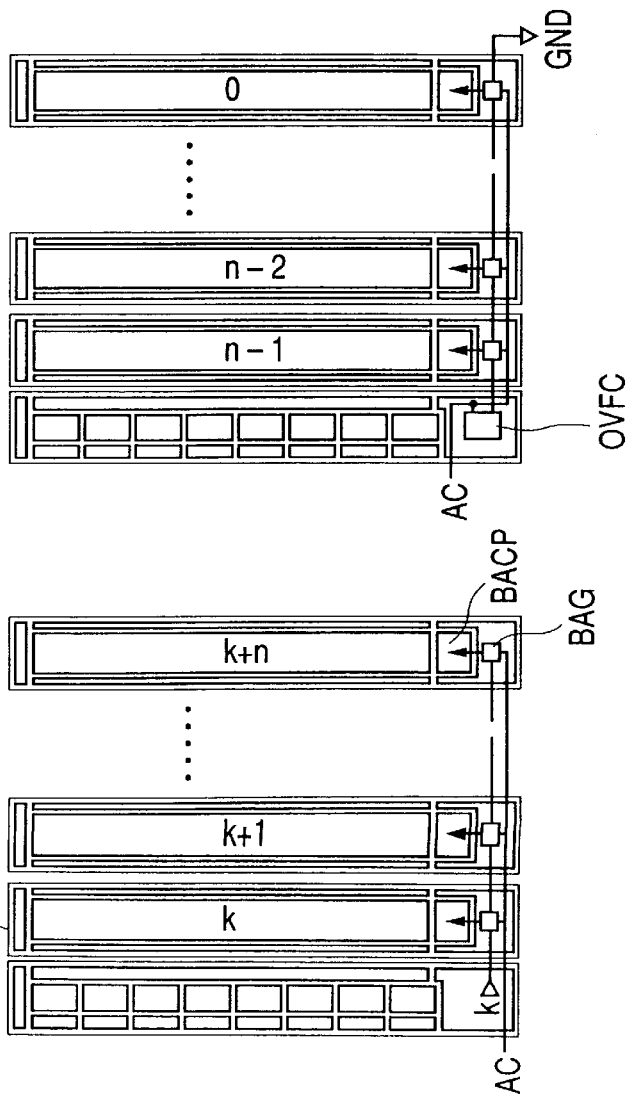

SEMICONDUCTOR INTEGRATED CIRCUIT DEVICE

BACKGROUND OF THE INVENTION

The present invention relates to a semiconductor integrated circuit device, and principally to a technique which is effective for use in a RAM (Random Access Memory) mounted so as to mix with various logic circuits.

With advances in semiconductor technology the development of, a large scale integrated circuit is proceeding toward an approach or method for making combinations of large-scaled macros (cores) in a manner similar to the design of a printed circuit board using combinations of parts. A memory is essential to digital signal processing. Particularly since a dynamic RAM has the feature that a large storage capacity is obtained, it plays an important role in the design of the above-described large scale integrated circuit.

A dynamic RAM is typically divided into a plurality of banks, and a read or write operation is performed on each selected bank. Such a method of selecting a bank or a specific region or the like has been described in Japanese Patent Application Laid-Open Nos. Hei 9-245474, 2-83895, 4-313886 and 9-106684.

SUMMARY OF THE INVENTION

The inventors of the present invention have contemplated the standardization of a RAM core in consideration of the fact that, when many kinds of RAM cores are prepared as a RAM placed or mounted in the above-described large scale integrated circuit according to individual requests, their development and management will result in difficulties and an increased complexity. In light of this, we have thought of a novel operation control method which has taken into consideration the ease of use of a RAM mounted in a semiconductor integrated circuit device.

An object of this invention is to provide a semiconductor integrated circuit device which is equipped with a RAM capable of being provided in diverse configurations, while its design and management are simplified. Another object of this invention is to provide a semiconductor integrated circuit device which has improved ease of use for a RAM incorporated therein. The above and other objects, and novel features of the present invention will become apparent from the description provided in the present specification and the accompanying drawings.

A summary of a typical one of the features disclosed in the present application will be described in brief as follows: A RAM is mounted so as to mix with logic circuits and has a configuration wherein one control circuit is commonly provided for a plurality of memory mats, each including a memory array in which a plurality of memory cells are respectively placed at points where a plurality of word lines and a plurality of bit lines intersect, and an address selection circuit is provided for performing selecting operations on the word lines and the bit lines. Further, the number of memory mats is determined according to the required storage capacity, arithmetic circuits for respectively performing +1 or −1 arithmetic operations are respectively provided in the memory mats and connected in cascade form and include a first-stage arithmetic circuit having an input terminal supplied with address-setting address signals formed as fixed or programmable, input signals supplied to the arithmetic circuits or signals outputted therefrom are defined as address signals assigned thereto, and each of the comparators makes comparisons for detecting coincidence between the address signals and address signals inputted upon memory access, whereby each memory mat activates an address selecting operation according to receipt of a coincidence signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description when taken in connection with the accompanying drawings in which:

FIGS. 3A, 3B and 3C are, respectively, schematic block diagrams for describing another embodiment of bank address setting circuits each employed in the RAM module according to the present invention;

DETAILED DESCRIPION OF THE PREFERRED EMBODIMENTS

Preferred embodiments of the present invention will hereinafter be described with reference to the accompanying drawings.

Figure 1:
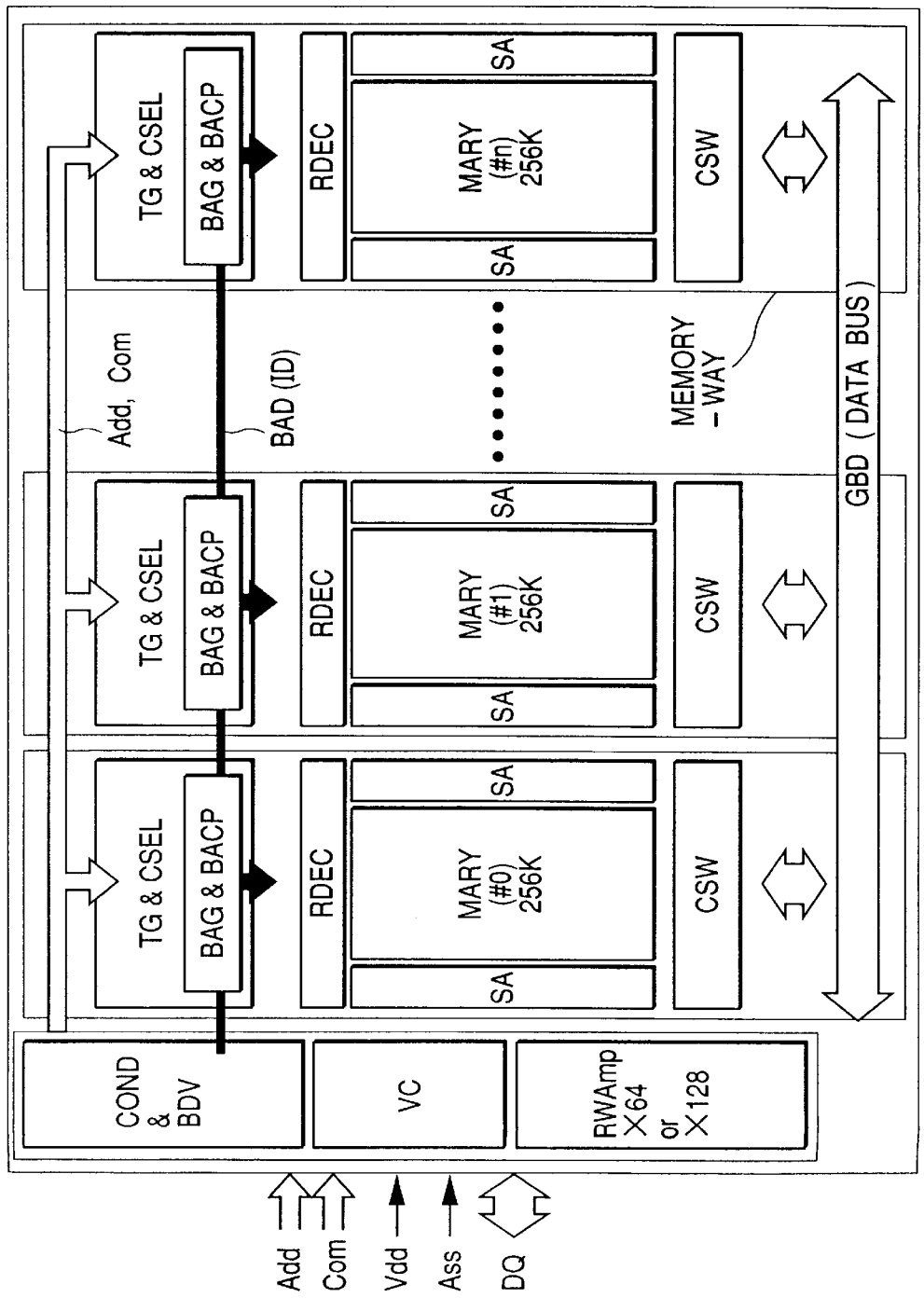
FIG. 1 is a block diagram showing one embodiment of a RAM module according to the present invention.

FIG. 1 is a block diagram of one embodiment of a RAM module according to the present invention. The RAM module according to the present invention is provided within one semiconductor integrated circuit device together with a digital processing circuit for performing writing and reading operations on the RAM module. The RAM module and the digital processing circuit are formed on a single semiconductor substrate like monocrystalline silicon by a known semiconductor integrated circuit manufacturing technique.

In the present embodiment, a control circuit and a power circuit are are provided in the same circuit area and commonly used for a plurality of memory mats. The control circuit comprises a command decoder COMD, a bus driver BDV for forming address signals and various control signals, and a read/write amplifier RWAmp. The power circuit VC produces or forms operating voltages, necessary for the operations of the internal circuits, in response to a power supply voltage Vdd and a ground potential Vss. A plurality of memory mats are provided for the control circuit and the power circuit. The plurality of memory mats are equal in configuration to one another and each comprise a memory array MARY, a sense amplifier SA, a row decoder RDEC, a column switch CSW, a bank address generator BAG, a bank address comparator BACP for making a decision as to a comparison and coincidence with a specified bank address and a timing generator TG, and a column selector CSEL.

In each memory array MARY, word lines are 256 in number and complementary bit lines consist of 1024 pairs. Thus, the entire memory array has a storage capacity of about 256K bits. The column switch CSW connects the complementary bit lines of the 1024 pairs to 128 pairs of global bit lines GBD (data bus). That is, the complementary bit lines of each memory array MARY are divided into eight sets so as to perform 1/8 selecting operations.

In the control circuit, the 128 pairs of global bit lines GBD are divided in two sets of 64 pairs so as to allow inputs and outputs in groups of 64 bits. Thus, the control circuit is caused to have a partial column selecting function and may be utilized so as to allow the input and output of data in 64-bit (8-byte) units. In this case, 64 read amplifiers RA are commonly provided for the two sets of divided global bit lines GBD, whereas 128 write amplifiers WA are provided so as to correspond to the 128 pairs of global bit lines GBD.

The number of the write amplifiers WA is provided as 16 pairs or sets defined as one pair, eight by eight. A mask can be set for each pair. When a write operation is performed in 64-bit units, for example, the sixty-four write amplifiers WA placed in a selected state are rendered active and the remaining non-selected write amplifiers WA corresponding to 64 bits are brought to an output high impedance state. Thus, a write signal is transmitted to the 64 pairs of global bit lines GBD selected by the control circuit, of the 128 pairs of global bit lines GBD, so that a write operation is performed on memory cells electrically connected to half of the 64 pairs of complementary bit lines corresponding to the global bit lines GBD. Since the 64 pairs of global bit lines GBD corresponding to the remaining half are brought to a high impedance state, a signal read by the sense amplifier SA connected to the complementary bit lines connected through the column switch CSW simply appears, so that no writing is effected on the memory cells electrically connected to such complementary bit lines.

The operational control of each write amplifier WA can be applied even to the selected 64 write amplifiers. That is, specific bytes of the 64 bits (8 bytes) can be set so as not to be subjected to writing by bringing the output of each write amplifier WA to the high-impedance state. Thus, the write operation can be performed by a combination of arbitrary bytes within a range from one byte at minimum to eight bytes at maximum.

When, for example, an external logic circuit for each RAM module reads data in 64-bit units and electrically processes the data to thereby vary or change data corresponding to specific bytes alone, the logic circuit performs a process for inputting only changed data and specified bytes corresponding thereto, thereby allowing renewal or reprogramming of data. Alternatively, when it is desired to change only specific bytes of the 64-bit data, data corresponding to the specific bytes may be generated and inputted without temporarily reading the 64-bit data. Such data processing will result in a function convenient for such image processing as to create data by paying attention to only pixels at points to be drawn while the background is held as it is. Such a mask function of each write amplifier WA can exhibit or bring about even the effect that the power consumption can be reduced because the 64 write amplifiers WA are not activated at all times as described above.

A mask function may be provided wherein 128 read amplifiers RA are provided and the read/write operation is performed in 128-bit units, and the read/write operation in the 128-bit units is allowed as a basic operation, whereas, upon the write operation, the write amplifiers WA are divided into a plurality of sets or pairs so that they can be activated for each of the respective sets. When the 128 read amplifiers RA are provided as described above, a process for DQ on an input/output line, which is supplied to the control circuit, is performed in the 128-bit units. A selector may be provided in the control circuit so as to permit switching between access to the RAM modules in the 128-bit units and access to the RAM modules in the 64-bit units.

The present embodiment is provided with the function of switching the number of memory mats simultaneously selected in association with a bank configuration. That is, if the number of a plurality of mounted memory mats is defined as N, then the maximum number of banks is set to N and the minimum number of banks is set to 2. In this condition, the number of memory mats per bank is determined in inverse proportion to the number of the banks within an arbitrary range corresponding to the square power. When the number of banks is N, for example, the number of memory mats per bank becomes 1. When the number of banks is 2, the number of memory mats per bank results in N/2. When the number of banks is $2^n$ (where n is an integer greater than 1), the number of memory mats becomes $N/2^n$. The setting of such a bank configuration is performed by a bank address setting circuit BAG and a coincidence determination circuit BACP. A bank address BAD (or ID (self-identification) information) is assigned to each memory mat by the bank address setting circuit. When one memory bank is comprised of a plurality of pieces of memory mats as described above, a common bank address is set to the plurality of memory mats.

In order to select the complementary bit lines in the 128 pairs of units as described above from any of the plurality of memory mats and connect the same to the corresponding global bit lines GBD, a column-system selecting operation is applied to one memory mat of N memory mats corresponding to one bank referred to above. Each memory mat has eight pairs of column switches and is correspondingly provided with a column decoder for decoding the three rightmost bits of column addresses to thereby select one (128 bits) of the eight pairs of column switches. When one memory bank is made up of N memory mats, the column decoder for one of the N memory mats is selected by the corresponding column selector CSEL.

The maximum number of memory mats mountable to one RAM module is determined. Thus, the above-described column selector CSEL is caused to have or hold decode functions having selecting functions corresponding to the number of the mountable memory mats. In regard to each column-system selecting operation, the column selector selects a column switch for one memory mat without regard to the bank configuration. When, for example, the maximum number of RAM modules is set to 16, the column selector is caused to perform 16 types of selecting operations using 4-bit column addresses.

Accordingly, a substantial bank configuration can be realized under the control of row-system selecting operations to be next described. When the number of banks is 2 where there are provided 16 memory mats, a row-system circuit is selected (activated) for memory mats set eight by eight. One of the selected eight memory mats is selected by the corresponding column selector CSEL and is electrically connected to the corresponding global bit lines GBD.

Only the most significant bit of bank-specifying row address signals composed of 4 bits is made valid and the three rightmost bits are made invalid. In this condition, the corresponding row-system circuit is selected for the memory mats set by eight. When the number of banks is regarded as 4 and the number of memory mats per bank is set to 4, the two rightmost bits of the 4-bit address signals are rendered invalid to thereby specify four memory mat groups and select the same in the same manner as described above. Thereafter, one memory mat thereof is selected by the corresponding column selector CSEL. When the number of banks is defined as 8 and the number of memory mats per bank is set to 2, the one rightmost bit of the four bits is made invalid to thereby specify or designate two memory mat groups and select the same in the same manner as described above. Thereafter, one memory mat thereof is selected by the corresponding column selector CSEL. In order to define the number of banks as 16 and set the number of memory mats per bank to 1, a row-system selecting operation is effected on one memory mat by use of the 4-bit addresses so that the corresponding memory mat is selected by the column selector CSEL.

As described above, each of the individual memory mats can be basically separately selected. Therefore, address signals Add and a command Com for specifying or designating an operation mode are transmitted to each of the individual memory mats through a common address and a command bus. That is, signal buses Add and Com for transferring addresses and commands are extended so as to correspond to the memory mats mounted in the same manner as the global bit lines GBD.

The timing generator TG provided for each memory mat generates various timing signals such as timing for selecting each word line in each memory array MARY, an activation signal for each sense amplifier SA and timing signals for precharging complementary bit lines, and the like. In a dynamic RAM, the word line selecting timing and the sense amplifier activating timing are respectively set to a required time until a read signal necessary for complementary bit lines is obtained from a memory cell according to the word line selecting operation. A timing signal provided to activate the corresponding column switch CSW is formed only when the operation of amplification by each sense amplifier is completed.

In the present embodiment, the plurality of memory mats are divided into plural pairs or sets to construct the plurality of banks as described above. When one bank is constructed of N memory mats where the total number of memory mats is M, for example, the number of banks is set to M/N. Now, the banks referred to above indicate the magnitudes or sizes of memories which are readable/writable independently according to one memory access. In the case of the above-described embodiment, the minimum bank comprises one mat and the number of banks at this time is set to the maximum like M. On the other hand, the minimum number of banks is set to 2 and the number of memory mats per bank at this time will result in M/2. It is meaningless or useless to construct one bank from the M mats. That is, this is because particular meaning is given to the fact that the plurality of banks can respectively perform read/write operations separately with the plurality of banks as the premise as described above.

An advantage is brought about that an increase in the number of memory mats per bank allows an increase in the number of data which is readable/writable according to one memory access. On the other hand, an increase in the number of memory banks permits a pipeline operation utilizing the ability to obtain memory access to the respective banks independently. As a result, high-speed read/write operations can be executed. In a dynamic memory cell, for example, a relatively long time interval is spent until an electrical charge stored in each small capacitor is sensed to thereby obtain a read signal. Therefore, the pipeline operation for accessing a plurality of banks sequentially can be performed so that read data can be sequentially obtained from the plurality of banks in order except for a few cycles up to the output of the first data.

Even in the case of a static memory cell having an amplifying function itself, MOSFETs constituting memory cells are taken low in conductance for the formation of a mass storage capacity or for high integration. Therefore, a signal read into a bit line or a data line to which each memory cell is electrically connected, is brought to a relatively small signal level. It is also necessary to provide a sense amplifier to sense the signal level. Thus, even when such a static memory cell is used, although there is a difference in degree, high-speed reading can be expected to a sufficient degree by providing a plurality of banks as described above and performing a pipeline operation for allowing access to the banks sequentially.

In the present embodiment, the maximum storage capacity of the RAM module used as the memory circuit is determined according to the data processing operation of the semiconductor integrated circuit device upon its design. That is, the number of memory mats MAT mounted to the RAM module is determined. The plural types of bank configurations are prepared using such memory mats MAT according to the classification of data processing using the memory circuit, i.e., the write and read operations for the memory circuit. Switching between such bank configurations is allowed by the control circuit. In the case of a semiconductor integrated circuit device which is battery-driven as in the case of a portable information device or the like in addition to the above, the semiconductor integrated circuit device may be used in such a manner that when it is battery-driven or the voltage of the battery is becomes low, the number of the banks are set in large numbers and the number of memory mats activated according to one memory access is set to the minimum like 1 so as to reduce the peak current, whereby it can be battery-driven up to a low-voltage region.

The simplest configuration is one wherein a control circuit is supplied with a stationary or fixed signal level in accordance with a master slice system to thereby set the number of banks to the RAM module. Owing to such a configuration, for example, N mats are taken per bank. If such a configuration that a logic circuit lying outside the RAM module is provided with a register and the number of banks is set to the register, is taken, then the bank configurations can be set one by one in association with the data processing operation by using the same RAM module.

Although the control circuit becomes complex more or less, a configuration may be adopted wherein M memory mats are divided into two sets or pairs of M/2 and the number of banks is set for every set. Even in this case, the number of banks set fixedly in the above-described manner or the number of banks set each time using the register or the like may be adopted. Although the invention is not restricted in particular to this configuration, the operation of writing/reading of data requiring high-speed access during data processing may utilize one set in which the number of banks is set in large numbers, whereas the operation of collective writing and reading of large amounts of data may use the other set in which the number of banks is reduced and the number of memory mats per bank is increased.

Figure 2:
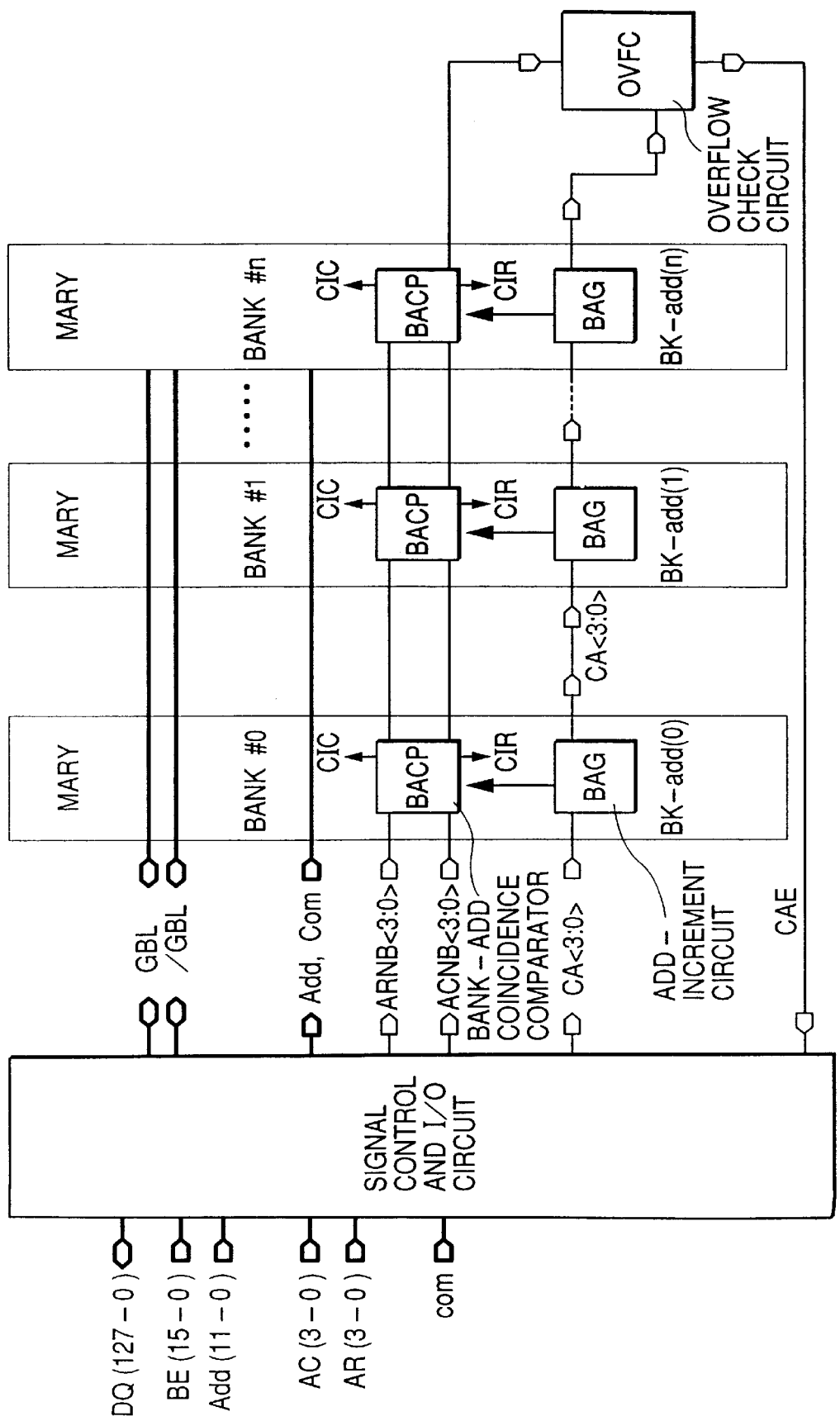
FIG. 2 is a schematic block diagram for describing a bank address setting system employed in the RAM module according to the present invention.

FIG. 2 is a schematic block diagram for describing one embodiment of the bank address setting circuit employed in the RAM module according to the present invention. When a register is used for the setting of each bank address, ones identical in configuration to each other can be used as respective memory mats. However, the bank address must be conversely set each time power is turned on. When a ROM to be written in accordance with the master slice system is used, it is unnecessary to set the bank configurations one by one each time power is turned on. However, it is necessary that such a ROM is formed so as to vary in ROM's mesh or lattice according to the bank configurations. Thus, this will result in complexity of circuit design. That is, when only the bank-address set portions cannot be commonly used for each of the individual memory mats and the maximum mountable number is defined as 16, as described above, it is necessary to create sixteen types of memory mats set in macrocell form or to manually set mat addresses in accordance with a master slice.

In the present embodiment, the same bank address setting circuits are respectively contrived so as to be able to automatically set different bank addresses while being used in the respective memory mats. Binary adder circuits (Increment circuits) are provided as the bank address setting circuits BAG provided in the respective memory mats. When n+1 memory mats having bank addresses (BK-add) comprised of 0 through n are placed, for example, the memory mats of #0 through #n are arranged and their adder circuits are connected to each other in tandem form. An initial address like 0000 is supplied as an address input (CA<3 : 0>) comprised of 4 bits for the leading memory mat. In doing so, the adder circuit in the leading memory mat performs a +1 adding operation to form an added output of 0001 and transfers it to a second memory mat. Since the adder circuits in the respective memory mats are connected in tandem form in order, +1 adding operations are performed subsequently each time the address input passes through the adder circuits, so that binary addresses are formed like 0010, 0011, 0100 . . . .

Owing to such a construction, a bank address given as 0000 is set to the leading memory mat. Further, an address of 0001 formed by the adder circuit in the leading memory mat is assigned to the second memory mat, an address of 0010 formed by the adder circuit in the second memory mat is assigned to the third memory mat, and an address formed by the adder circuit in the n−1th memory mat in accordance with a decimal system is assigned to the nth memory mat. Since the address setting circuits of the respective memory mats can comprise the same adder circuits in this configuration, different bank addresses can be set by simply arranging the same memory mats.

The bank addresses respectively assigned to the respective memory mats and the bank addresses inputted through the control circuit are compared by the bank address coincidence comparators BACP. Since different bank configurations can be set while using fixed bank addresses in the present embodiment, a row-system bank address ARNB <3 : 0> and a column-system bank address ACNB <3 : 0> are inputted. That is, each bank address comparator BACP comprises two pairs of coincidence comparators and produces or forms coincidence comparison signals CIC and CIR to be obtained from a comparison between the bank address generated by the corresponding bank address setting circuit BAG and the two types of row-system and column-system bank addresses ARNB <3 : 0> and ACNB <3 : 0>.

When the result of determination as to the least significant bit is made invalid in the row-system coincidence comparator, the coincidence comparison signal CIR is formed simultaneously for the two banks. On the other hand, the simultaneous selection in the column system as described above will cause a problem that complementary bit lines of a plurality of memory mats simultaneously selected on the global bit lines GBL are simultaneously selected. Therefore, the column-system coincidence comparison signal CIC is formed as one for each bank address assigned to each memory mat as described above. On the other hand, the row-system selecting operation will not only cause no problem because the word lines are simply selected in the plurality of memory mats, but also allows the input/output of large amounts of data at high speed in serial form by the simple switching of the column-system selecting operation because the word lines are simultaneously selected in the plurality of memory mats and the information stored in each memory cell is amplified by the corresponding sense amplifier SA. That is, when a storage capacity of 1024 bits at maximum is read from each memory mat by the updating of each column address and one memory bank is made up of N memory mats, large amounts of data corresponding to N×1024 bits at maximum can be input and output.

In the RAM module, the number of memory mats to be mounted thereto is arbitrary. Therefore, no problem shows where the memory mats corresponding to 16 at maximum are mounted based on the 4-bit bank addresses as described above, for example. However, there is a possibility that when a non-existing bank address is erroneously specified where, for example, only a number of memory mats smaller than 16 is mounted, a non-existing memory mat will be specified, so that the global bit lines GBL remain held at the same precharge signal, whereby a needless or excessive current will flow through a read amplifier RA that receives the precharge signal and meaningless data will be treated as effective or valid data on the system side. As a result, errors such as a program runaway, etc. might occur.

When the bank addresses formed by the adder circuit in the final-stage memory mat are supplied to an overflow check circuit, where access to non-existing bank addresses is detected by comparing the magnitudes thereof, the control circuit prohibits the operation of the read amplifier within the RAM module and the logic circuit for providing read and write instructions for the RAM module is provided with the additional function of indicating a bank-designation error through the control circuit.

FIGS. 3A, 3B and 3C are respectively schematic block diagrams for describing another embodiment of bank address setting circuits each employed in the RAM module according to the present invention. The RAM modules illustrated in FIGS. 3A through 3C are configured in the same manner as the RAM module shown in FIG. 1 or 2 so that control circuits are provided on the right sides and memory mats identical in configuration to each other are placed side by side in plural form.

In the configuration shown in FIG. 3A, the initial bank address can be set to an arbitrary value k as fixed or programmable by the corresponding control circuit. That is, a 0th memory mat is set to (mat address) k and a k+1th bank address is generated from the adder circuit of the 0th memory mat with k as the reference. The generated address is supplied as a bank address for a 1st memory mat. Bank addresses are sequentially set to the memory mats up to a k+nth memory mat as in the case of k+2, k+3, . . . . A signal AC is an external bank address inputted upon memory access.

In the configuration illustrated in FIG. 3B, a bank address corresponding to a ground potential GND is set to an n−1th memory mat farthest from the control circuit, i.e., an address of 0000 is set thereto when the memory mats are specified by 4 bits as described above. Further, bank addresses increased by +1 in the direction opposite to that in the second embodiment are set to their corresponding memory mats. In this configuration, the maximum bank address (mat address) is designated to a 0th memory mat located adjacent to the control circuit, and the overflow check circuit OVFC can be placed in the control circuit. Further, the routing of wires or interconnections for transmitting an overflow detection signal becomes unnecessary and the circuit layout can be rationally designed.

In the configuration shown in FIG. 3C, a bank address corresponding to a ground potential GND is set to an n−1th memory mat farthest from the control circuit, i.e., an address of 0000 is set thereto when the memory mats are specified by 4 bits as described above. Further, the maximum bank address (mat address) is designated to a 0th memory mat disposed adjacent to the control circuit in the same manner as described above and the overflow check circuit OVFC is placed in the control circuit.

Although the invention is not restricted in particular, the bank addresses designated to the respective memory mats are inverted by inverters, after which they are compared with an external bank address AC. Thus, although a bank address given as 0000 is assigned to a 16th memory mat in the above-described bank address setting circuit when, for example, 16 memory mats are mounted, an address given as 1111 is assigned thereto by performing a comparison with its inverted signal. Although 0001 is inputted to a 15th memory mat, a comparator compares 1110 with it. In the 0th memory mat achieved by reducing the bank addresses to be compared by the comparator successively by −1 in the same manner as described above and located adjacent to the control circuit, each bank address compared by the comparator is compared with an inverted signal 0000 of 1111. Thus, this becomes equivalent to the assignment of substantial bank addresses to their corresponding memory mats by the decimal system as in the case of 0 through n−1.

However, when the number of memory mats is, for example, eight smaller than the maximum number (16) as described above, an equivalent bank address of a memory mat disposed adjacent to the control circuit will not result in 0 but 0111 (7 in the decimal system). The adder circuit used as the bank address generator provided in each memory mat may be replaced by a subtractor or subtraction circuit. That is, since the bank addresses or mat addresses may be set so as not to include the same ones, bank addresses which are different from each other may be assigned to their corresponding memory mats so that they are increased or decreased by 1 for every memory mat.

Figure 4A:
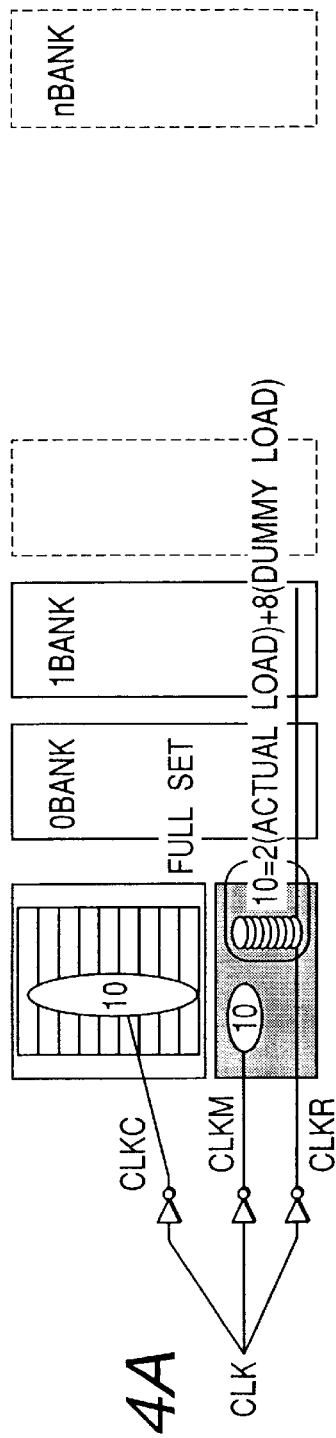
FIGS. 4A, 4B and 4C are, respectively, schematic block diagrams illustrating another embodiment of the RAM module according to the present invention.
Figure 4B:
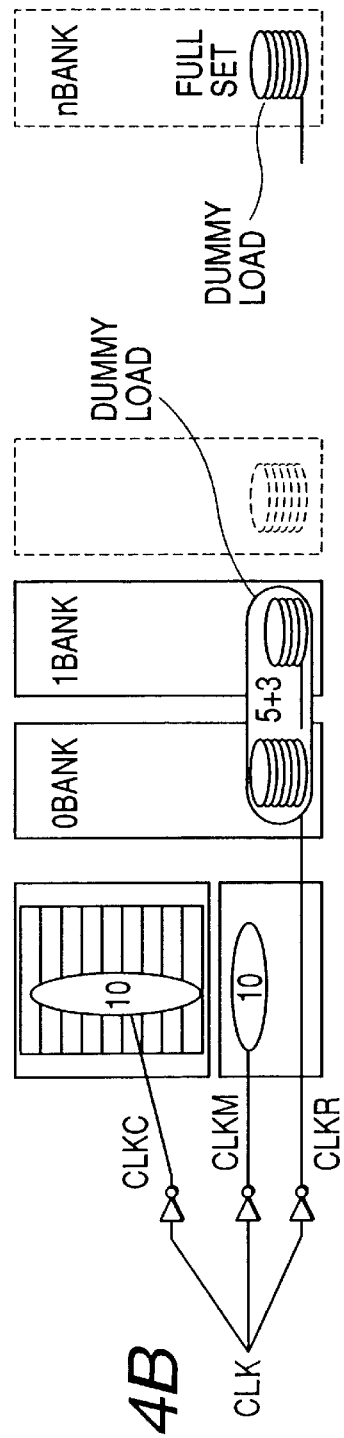
Figure 4C:
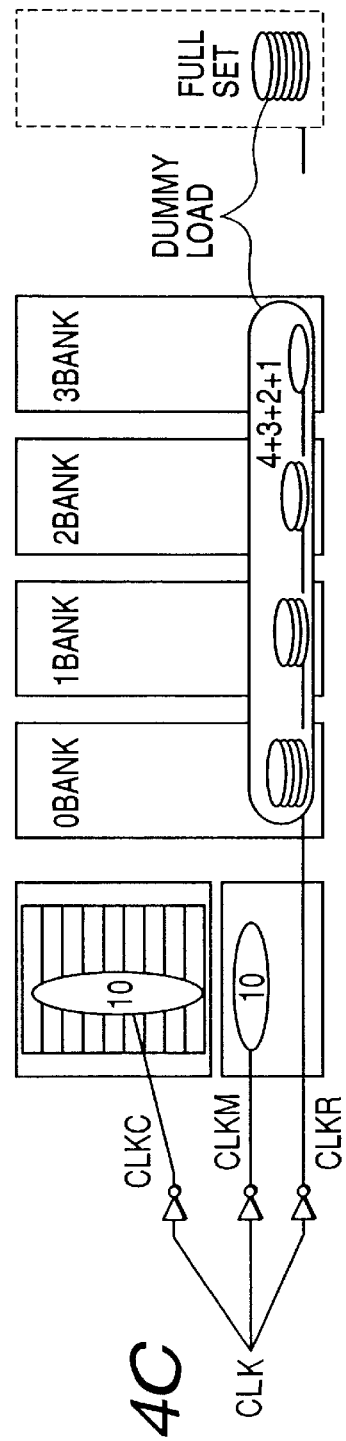

FIGS. 4A, 4B and 4C are respectively schematic block diagrams of another embodiment of the RAM module according to the present invention. The RAM modules according to the present embodiments are respectively set so as to differ in the number of memory mats from each other in association with required storage capacities. That is, since a control circuit is commonly used for a different number of memory mats, loads as viewed from the control circuit vary according to the storage capacity. For example, a clock signal CKR supplied commonly to drivers or memory mats for supplying address signals and commands is subjected to a heavy load as the number of memory mats increases.

A signal transfer speed or rate varies according to whether the load is light or heavy, so that time intervals spent on memory access differ from each other. It is thus necessary to set many time margins for timing adjustments. In each of bank address setting circuits of the the above-described memory mats in the present embodiment, the number of mounted memory mats can be recognized by decoding a signal outputted from an adder circuit corresponding to the final stage, in other words, bank addresses inputted to the overflow check circuit OVFC. The control circuit is caused to hold load driving power corresponding to memory mats equivalent to the maximum mountable number by using this, and various timing adjustments are set under the conditions of the memory mats corresponding to the maximum mountable number to thereby create circuits, whereby standardization on the control circuit side is achieved.

Dummy load circuits are placed in the control circuit or each memory mat. Although the invention is not restricted in particular, each dummy load circuit comprises a load circuit comprised of a MOS gate capacity or the like. The dummy load circuit is created or fabricated and placed so as to be selectively connectable to the address bus, the command bus or a signal transmission path for the clock signal CKR or the like through switch MOSFETs or the like.

When the number of actually mounted memory mats is two: BAK#0 and BAK#1 as shown in FIG. 4A, eight dummy load circuits provided in the control circuit are connected to each other and in this condition, the entire load as viewed from the driver of the control circuit is adjusted so as to take 10. In FIG. 4B on the other hand, the dummy load circuits are provided so as to be distributed over the respective memory mats. Thus, when the number of actually mounted memory mats is two: BAK#0 and BAK#1 in the same manner as described above, dummy load circuits provided for the implemented BAK#0 and BAK#1 are connected to each other and in this condition, the overall load as viewed from the control circuit is adjusted so as to take 10. In this configuration, when the number of memory mats mounted as shown in FIG. 4C increases to 4 as in the case of BAK#0 through BAK#3, dummy load circuits provided for the BAK#0 through BAK#2 are distributedly connected to each other and in this condition, the overall load as viewed from the control circuit is set so as to take 10 in the same manner as described above. Although omitted in the same drawing, the dummy load circuits are not connected to the control circuit in the embodiment illustrated in FIG. 4A in the maximum-mounted state up to BAK#n, whereas in the embodiment illustrated in FIG. 4B, they are not connected even to any of BAK#0 through BAK#n. Each load as viewed from the control circuit side is adjusted so as to take 10 which is the same as above.

In regard to clock signals, clock signals CLKC and CLKM used in each control circuit based on an externally supplied system clock signal CLK are set so as not to produce phase shifts according to the lightness or heaviness of a load and so that the load takes 10 in the same manner as described above if the same clock drivers are used. Correspondingly, a clock signal CLKR supplied from the control circuit to the respective memory mats is used to adjust the load to 10 in the same manner as described above according to the selective connection of the dummy load circuits. Such adjustments provide synchronization of the clock signals and the setting of timing margins taking into consideration the skew of each clock signal and can be made to the minimum required. As a result, the operating frequency can be speeded up.

In the present embodiment, the switching between bank configurations is allowed as described above. That is, there are two cases upon the row-system selecting operation: one in which only one memory mat is activated upon the row-system selecting operation and another in which two or more memory mats are simultaneously activated. If loads as viewed from the control circuit differ from each other and the signal transfer rate is affected thereby owing to the simultaneous operation of the plurality of memory mats in this way, then the switching between dummy load circuits may be done in the same manner as described above based on the bank specifying information so that the signal transfer rate is adjusted to a constant without regard to the bank switching.

Figure 5:
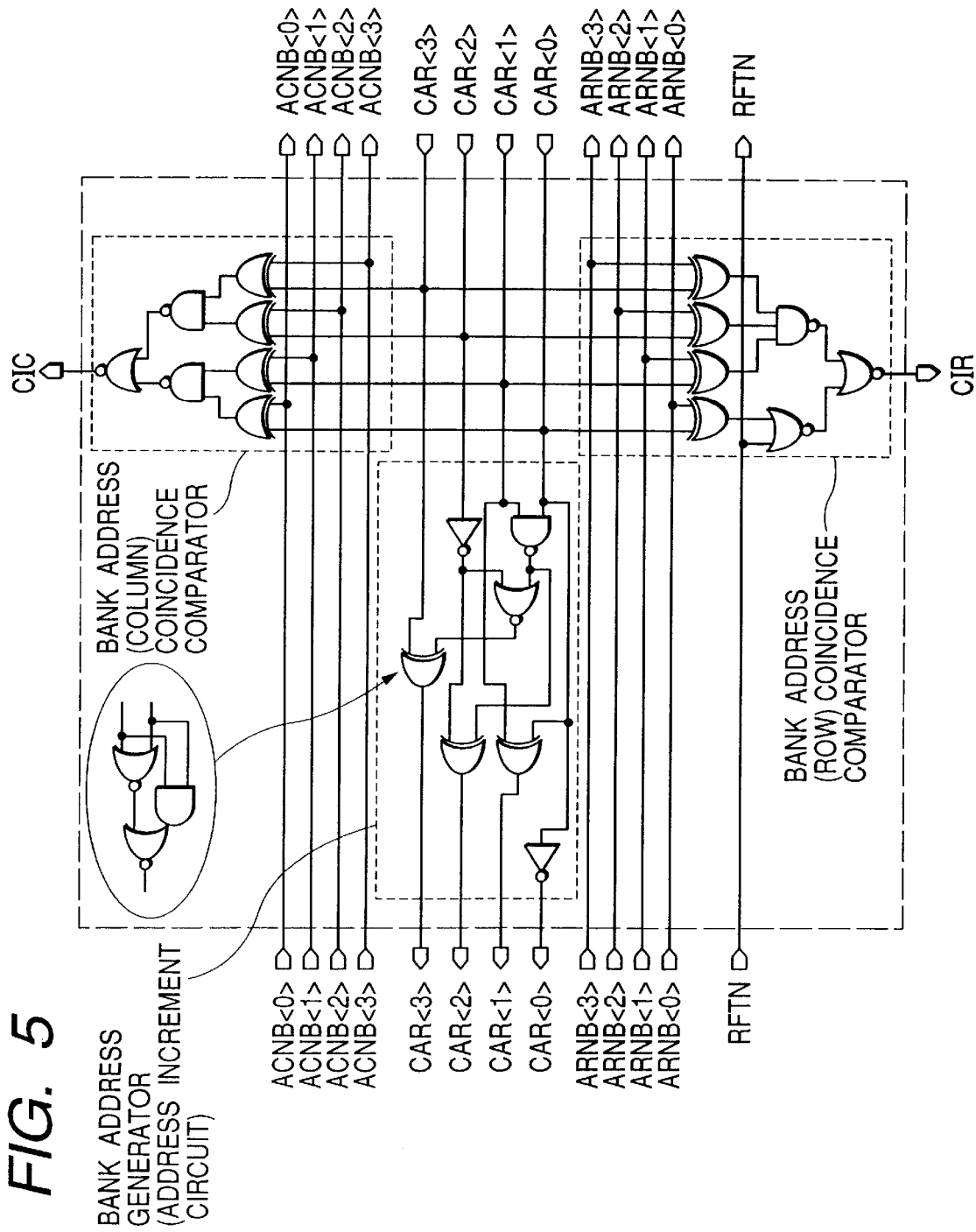
FIG. 5 is a circuit diagram showing one embodiment of a bank address generator and bank address coincidence comparators according to the present invention.

FIG. 5 is a circuit diagram showing one embodiment of the bank address generator and the bank address coincidence comparators. The bank address generator comprises a +1 adder circuit and takes in or captures input bank addresses CAR<0>, CAR<1>, CAR<2> and CAR<3> comprised of 4 bits as self bank addresses. Further, the bank address generator performs a +1 adding operation on them to thereby generate bank addresses CAR<0>, CAR<1>, CAR<2> and CAR<3> comprised of 4 bits, which are used for the following stage.

The adder circuit comprises the following respective circuits. The output signal CAR<0> corresponding to the least significant bit is formed by inverting the input signal CAR<0> corresponding to the least significant bit by an inverter. The output signal CAR<1> corresponding to a second bit is formed by an exclusive OR circuit which receives therein the input least significant bit CAR<0> and the second bit CAR<1>. The output signal CAR<2> corresponding to a third bit is formed by an exclusive OR circuit which receives therein the output of NAND of the input least significant bit CAR<0> and the second bit CAR<1> and a signal obtained by inverting the third bit CAR<2>. Further, the output signal CAR<3> corresponding to the most significant bit is formed by forming the output of a NOR of a the output of NAND of the input least significant bit CAR<0> and the second bit CAR<1>, and the inverted signal of the third bit CAR<2>, and supplying it and the input signal CAR<3> corresponding to the most significant bit.

Two column- and row-systems are provided as the bank address coincidence comparators. That is, a column-system bank address coincidence comparator determines corresponding bits of the input bank addresses CAR<0>, CAR<1>, CAR<2> and CAR<3> comprised of the four bits and column-system bank addresses ACNB<0>, ACNB<1>, ACNB<2> and ACNB<3> designated or specified upon memory access, using exclusive OR circuits (coincidence/non-coincidence circuits), and thereby takes out a coincidence signal for all bits by NAND and NOR gate circuits.

Similarly, the row-system bank address coincidence comparator makes a decision as to corresponding bits of the input bank addresses CAR<0>, CAR<1>, CAR<2> and CAR<3> comprised of the four bits and row-system bank addresses ARNB<0>, ARNB<1>, ARNB<2> and ARNB<3> designated upon memory access, by exclusive OR circuits (coincidence/non-coincidence circuits), and thereby takes out a coincidence signal for all bits by a NAND gate circuit.

In the present embodiment, the output of an exclusive OR circuit corresponding to the least significant bits CAR<0> and ARNB<0> is provided with its corresponding NOR gate circuit to allow switching to the row-system selecting operation such as to provide or form a plurality of memory mats per bank. In order to forcefully set a signal outputted from such a NOR gate circuit to a coincidence signal, the input of the exclusive OR circuit is supplied with a control signal RFTN. Thus, if the control signal RFTN is set to a logic 1, the coincidence signal is formed in the row system even if the least significant bit of the bank addresses is 0 or 1, so that substantially the same bank address can be set to two memory mats.

If such a function as to form or construct four memory mats per bank is also added, then a signal RFTN1 is provided as the control signal RFTN in association with the least significant bits CAR<0> and ARNB<0> and a signal RFTN2 is provided as the control signal RFTN in association with the low-order second bits CAR<1> and ARNB<1>. When two memory mats are formed per bank, the signal RFTN1 may be set to logic 1. When four memory mats are formed per bank, the signals RFTN1 and RFTN2 may be set to logic 1.

The bank address generator and bank address coincidence comparators shown in FIG. 5 can be all constructed of the same circuits with respect to all of the memory mats #0 through #n shown in FIG. 2. Therefore, the memory mats can commonly use one type of memory mat configured in macrocell form. The above type of memory mat configured in macrocell form can be used for a plurality of types of RAM modules which are different from one another in the number of memory mats and bank configuration, whereby the circuit design and layouts can be greatly simplified.

The bank address generator and bank address coincidence comparators comprise the simple logic gate circuits shown in the drawing. Since the adder circuit used as the bank address generator simply performs a so-called static signal transfer operation alone in particular, its driving power may be extremely small. Thus, since elements, which constitute these respective circuits, can be formed on an extremely small scale, they can be fabricated on a semiconductor substrate below wiring channels for transferring the respective signals CAR<0> through CAR<3> used for the generation of the bank addresses. For example, the respective signals CAR<0> through CAR<3> can be formed by a metal wired layer corresponding to a third layer, and wires or interconnections for connecting between the respective gates constituting the adder circuit can be formed by making use of metal wired layers corresponding to a second layer and a first layer placed therebelow.

This can be applied even to each bank address coincidence comparator in a manner similar to the above. Elements, which constitute the bank address coincidence comparator, can be fabricated or made up on a semiconductor substrate below wiring channels in which the bank addresses ARNB<0>, ARNB<1>, ARNB<2>, ARNB<3> and ACNB<0>, ACNB<1>, ACNB<2> and ACNB<3> are respectively formed and below the wiring channels in which the above-described signals CAR<0> through CAR<3> are formed. As a result, the memory mats can be formed with a high integration In the present embodiment, each bank address has two meanings as described above. That is, the bank addresses are placed in a one-to-one correspondence with the mat addresses as viewed in the column system. On the other hand, they are not associated with the mat addresses in the row system and are increased and decreased in proportion to the number of banks in a word. That is, when the number of banks is equal to the number of mats, the bank addresses are placed in one-to-one correspondence as described above. However, when the number of banks reaches half the number of mats, the bank addresses are reduced to ½ correspondingly. Described more specifically, when the number of mats is 16, the number of mat addresses reaches 16 types or kinds. However, when the number of banks is reduced to eight, equal to one-half the number of mats as viewed in the row system, the one rightmost bit of the four bits is rendered invalid during the row-system bank address coincidence comparison operation as described above, so that the row-system bank addresses are reduced to eight kinds.

Thus, the column-system signal transmission paths of the memory mats are connected in parallel, and the bank addresses and mat addresses are placed in one-to-one correspondence with each other in the column system to avoid overlap selection. Further, the word lines for the plurality memory mats are simultaneously selected in association with the bank configuration in the row system. As a result, the reading and writing in each bank can update row-system address signals and allow the input/output of data at high speed according to sequential access based on column switching.

Figure 6:
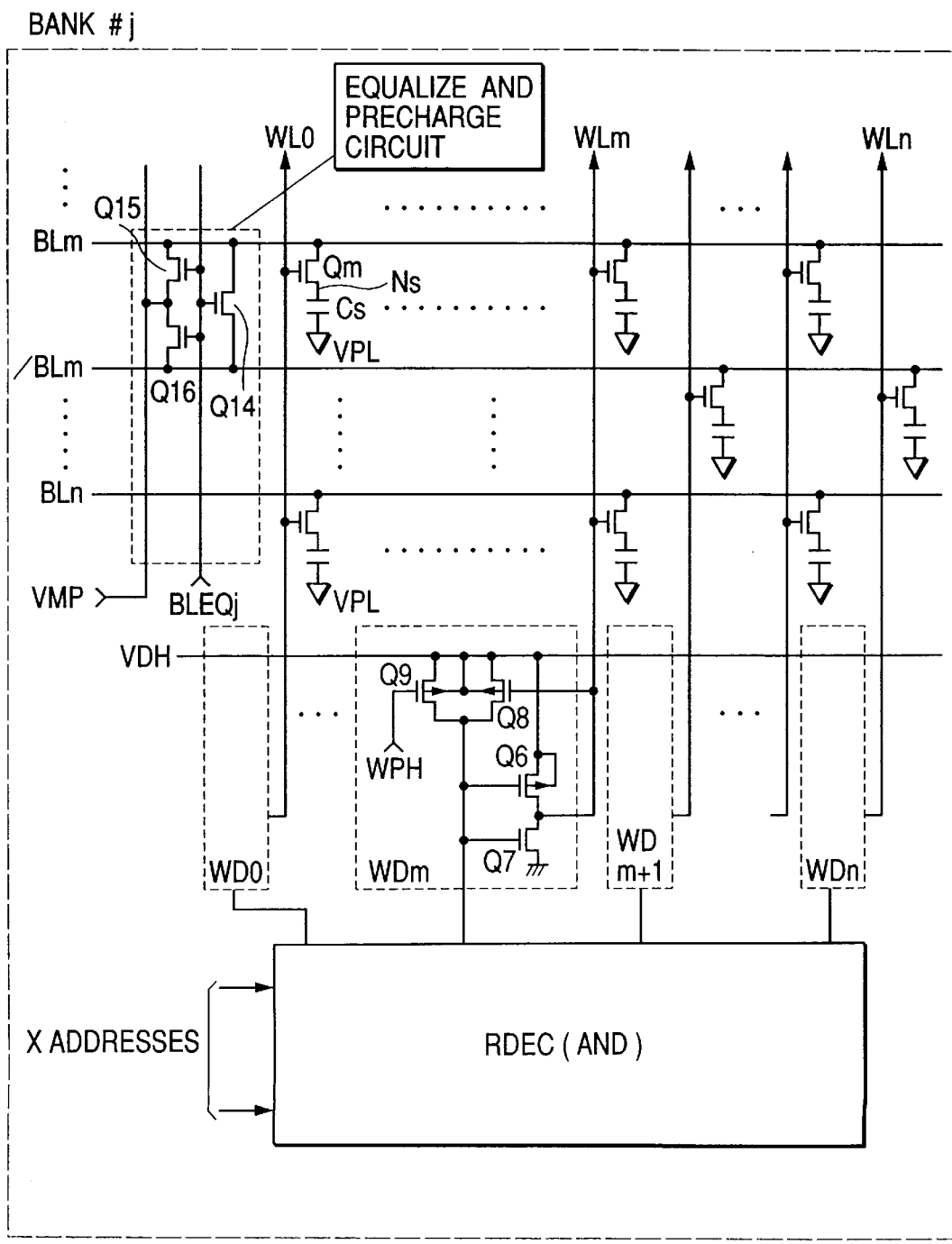
FIG. 6 is a circuit diagram depicting one embodiment of a memory array and a word line selector employed in a memory mat of the RAM module.

FIG. 6 is a circuit diagram showing one embodiment of a memory array MARY and a word line selector employed in each memory mat referred to above. Each of the equalize and precharge circuits for bit lines, which are included in the memory array, is drawn together in the same drawing. One bank #j of the above-described banks #0 through #n is illustratively shown as a typical one in the memory mat shown in the same drawing. Of a plurality of complementary bit lines and a plurality of word lines provided within the bank (memory mat) #j, one pair of complementary bit lines BLm and /BLm and one bit line BLn, and word lines WL0, WLm, WLm+1 and WLn are illustratively shown as typical ones.

A memory cell provided at a point where the word line WL0 and the bit line BLm intersect, will be explained by way of illustrative example. The gate of an address selection MOSFET Qm is electrically connected to its corresponding word line. One source and drain of the MOSFET Qm are electrically connected to the bit line BLm. The other source and drain of the MOSFET Qm are electrically connected to a storage node Ns used as one electrode of a storage capacitor Cs. The other electrode of the storage capacitor Cs is used in common with the other electrodes of storage capacitors of other memory cells. A plate voltage VPL is applied to the other electrode of the storage capacitor Cs.

The above-described memory cells are placed in matrix form at points where the word lines and ones of the complementary bit lines intersect, respectively. In the word line WLm and the word line WLm+1 adjacent thereto, for example, a memory cell is provided at a point where the word line WLm and one bit line BLm of the complementary bit lines intersect, and a memory cell is provided at a point where the word line WLm+1 and the other bit line /BLm of the complementary bit lines intersect. In addition to the case in which the memory cells are alternately placed at ones of the complementary bit lines and the others thereof for every one of the odd and even word lines, memory cells in groups of two, which are respectively provided for every two word lines with the two word lines adjacent to each other as a pair, may be alternately placed at ones of the complementary bit lines and the others thereof.

N channel-type MOSFETs Q14 through Q16, which constitute each equalize and precharge circuit, are provided for the complementary bit lines BLm and /BLm. The MOSFET Q14 is set to a half potential by short-circuiting high and low levels (or low and high levels) of the complementary bit lines BLm and /BLm. The MOSFETs Q15 and Q16 are used to prevent the half potential based on the short-circuit of the complementary bit lines BLm and /BLm from varying due to leakage current or the like. Further, the MOSFETs Q15 and Q16 supply a half precharge voltage VMP to the complementary bit lines BLm and /BLm. The gates of these MOSFETs Q14 through Q16 are electrically commonly connected to one another so as to be supplied with a precharge and equalize signal BLEQj. That is, after the corresponding word line is reset from a selection level to a non-selection level, the signal BLEQj is changed to a high level, so that the MOSFETs Q14 through Q16 are brought to an on state to perform precharge and equalize operations for the complementary bit lines BLm and /BLm.

A plurality of word line drivers WD0 through WDn are respectively provided so as to correspond to the plurality of word lines WL0 through WLn. A specific circuit of the word line driver WDm corresponding to the word line Wm of these word lines is illustratively shown in FIG. 6. A CMOS inverter composed of a P channel-type MOSFET Q6 whose source is electrically connected to a set-up or boost source VDH, and an N channel-type MOSFET Q7 whose source is electrically connected to a circuit ground potential, is used for the word line driver WDm. The drains of the MOSFETs Q6 and Q7 are commonly connected to each other and constitute output terminals. Further, the drains thereof are electrically connected to the word line WLm. The gates of the MOSFETs Q6 and Q7 are commonly connected to each other and constitute input terminals. Further, the gates thereof are supplied with a selection signal produced from a row (X) decoder RDEC.

A precharge P channel-type MOSFET Q9 and a non-selection latch P channel-type MOSFET Q8 whose source-to-drain paths are respectively connected to one another, are provided between the input terminal of the CMOS inverter (Q6 and Q7) and the boost source VDH in parallel form. The gate of the non-selection latch P channel-type MOSFET Q8 is electrically connected to the output terminal of the CMOS inverter (Q6 and Q7). The gate of the precharge P channel-type MOSFET Q9 is supplied with a precharge signal WPH. A signal generator for forming the precharge signal WPH produces or forms a signal WPH having a high level corresponding to the selection level of each word line and a low level like the circuit ground potential with the boost source VDH as an operating voltage.

The above-described MOSFET Q14 is a MOSFET used for a level limiter. When an unillustrated sense amplifier is activated by a source voltage Vdd, a high level of the potential at the complementary bit line BLm or /BLm corresponds to the source voltage Vdd. The potential of the boosted voltage VDH is formed so as to become equal to the source voltage Vdd+Vth. When the sense amplifier is activated by a step-downed or deboosted internal voltage VDL, the boosted voltage VDH is brought to VDL+Vth. Here, Vth indicates the threshold voltage of the address selection MOSFET Qm and serves so as to transfer a signal having a high level like the source voltage Vdd or VDL applied to the complementary bit line BLm or /BLm, which is amplified by the amplifying operation of the corresponding sense amplifier, to its corresponding capacitor Cs without level losses.

Figure 7:
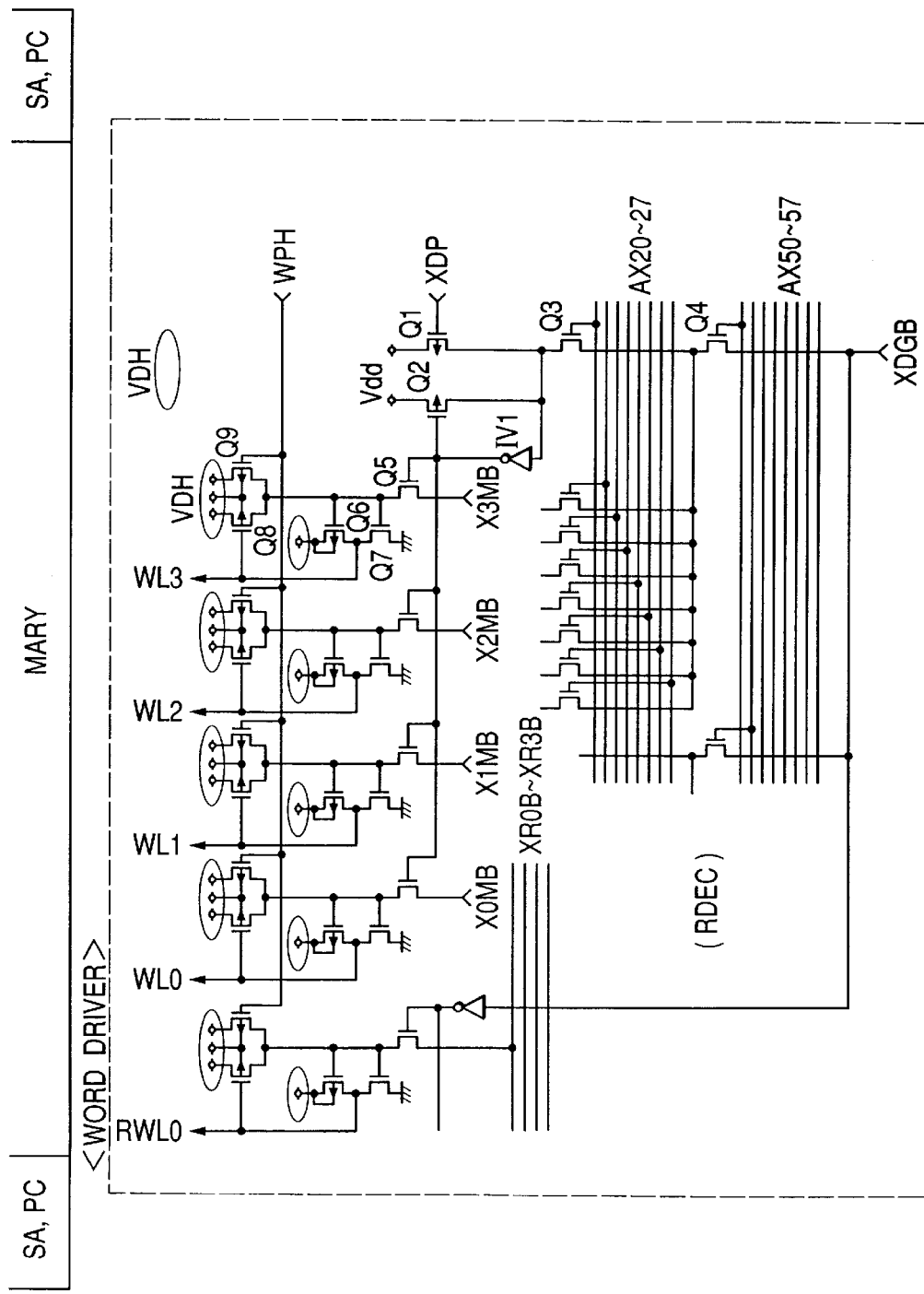
FIG. 7 is a circuit diagram showing one embodiment of a row decoder of the RAM module and a word driver connected thereto.

FIG. 7 is a specific circuit diagram showing one embodiment of the row decoder RDEC and a word driver connected thereto. AX20 through AX27 correspond to signals formed by predecoding row (X) address signals A2 through A4 comprised of 3 bits by a predecode circuit or predecoder. AX50 through AX57 correspond to signals formed by predecoding row (X) address signals A5 through A7 comprised of 3 bits by the predecoder. A MOSFET Q3 whose gate is supplied with one of the predecode signals AX20 through AX27, and a MOSFET Q4 whose gate is supplied with one of the predecode signals AX50 through AX57, are connected to each other in direct form to form the row decoder (RDEC), which in turn is supplied with a select timing signal XDGB.

The row decoder (RDEC) comprises a dynamic logic circuit formed in NOT-AND (NAND) configurations, which is provided with a P channel-type precharge MOSFET Q1 switch-controlled by a precharge signal XDP, an inverter for performing the latching of a non-selection level, and a P channel-type MOSFET Q2. A selection/non-selection decode signal is formed depending on whether a node precharged to a high level by the precharge MOSFET Q1 is discharged according to a low level of the timing signal XDGB through the MOSFETs Q3 and Q4. Although the invention is not restricted in particular, the timing signal XDGB is generated according to the result of decision by the first determination circuit or determinator. In addition to this, the generation of the predecode signals or word line select timing signals X0MB through X3MB to be described later may be rendered valid/invalid according to the result of decision by the first determinator so as to control the row-system selecting operation of each memory mat.

The P channel-type MOSFET Q2 is provided which feeds back a signal on the high level side to its input in response to the output signal of the inverter. The MOSFET Q2 serves to bring a decode output for bringing the MOSFET Q3 or Q4 to the an off state according to predecode output AX2I or AX5I to a high level precharged by the precharge MOSFET Q1. Since the MOSFET Q1 is turned off from the completion of the precharge period and the MOSFET Q3 or Q4 is turned off according to the predecode output AX2i or AX5i, this high level is brought to a floating state. Thus, there is a possibility that the high level will be undesiredly set to a selection level indicative of a low level by coupling or leakage current. Therefore, the feedback P channel-type MOSFET Q2 is turned on in response to the low level of the inverter IV1 to maintain the input level of the inverter at the source voltage Vdd.

Although the invention is not restricted in particular, the output signal of the inverter serves as a selection signal corresponding to four word lines WL0 through WL3. One word line specified by four kinds of word line select timing signals X0MB through X3MB obtained by decoding row (X) address signals A0 and A1 of low-order bits and adding the select timing signal to the decoded signals is selected from the four word lines WL0 through WL3.

When the output signal of the inverter is of a selection level indicative of a high level, the MOSFET Q5 is brought to an on state. Further, when one word line select timing signal X3MB referred to above changes from a high level to a low level, an input signal indicative of a low level is supplied to its corresponding word driver comprised of a P channel-type MOSFET Q6 and an N channel-type MOSFET Q7 activated according to the voltage of the boost source VDH so as to raise the word line WL3 connected to an output terminal of the word driver from a low level to a high level corresponding to the voltage of the boost source VDH.

When the output signal of the inverter is of the selection level indicative of the high level, other MOSFETs are turned on together with the MOSFET Q5. However, the word line select timing signals X0MB through X2MB remain at the high level and the N channel-type MOSFET of each word driver is turned on to allow the word lines WL0 through WL2 to remain at a non-selected state indicative of a low level. Each of P channel-type MOSFETs Q8 is a MOSFET for latching of a non-selection level. When the word line WL3 is held in a low level indicative of non-selection, the P channel-type MOSFET Q8 is turned on to set the input terminal of the word driver to the boosted voltage VDH, thereby turning off the P channel-type MOSFET Q6. Each of P channel-type MOSFETs Q9 is a precharge MOSFET and is turned on in response to the low level of the precharge signal WPH so that the input terminal of the word driver is precharged to the voltage of the sub power line SVCW.

When the output signal of the inverter is of the non-selection level indicative of the low level, MOSFETs shown with the MOSFET Q5 as a typical one, are turned off. Thus, even if any of the above-described word select timing signals X0MB through X3MB changes from a high level to a low level, the P channel-type MOSFET Q8 is turned on according to the low levels of the word lines WL0 through WL3 each corresponding to the precharge level without a response to it, so that the latch that the high level corresponding to the boost source VDH is fed back to the input terminal of the word driver, is made, whereby the word lines WL0 through WL3 or the like are held in a non-selected state.

A word driver, a latch MOSFET and a precharge MOSFET similar to those described above are provided even for a redundant word line RWL0. The redundant word line RWL0 is selected in synchronism with a redundant word line selection signal XR0B formed by a redundant circuit comprised of an unillustrated fuse circuit used for storage of each defective or faulty address and an address comparator for comparing the defective address with each input X address. Since, at this time, the predecode signals AX20 through AX27 and AX50 through AX57 from the predecoders used as normal circuits or the word line select timing signals X0MB through X3MB are respectively brought to a non-selection level according to a coincidence signal obtained from comparison with the defective address, no selecting operation is performed on each defective word line.

The sense amplifiers SA (precharge circuits PC) are provided on both sides of each memory array MARY employed in the present embodiment as shown in FIGS. 3A through 3C. The sense amplifiers corresponding to odd-numbered complementary bit lines and even-numbered complementary bit lines are distributed to the left and right sides to match the pitch of each of the complementary bit lines placed so as to intersect the word lines WL0 through WL3 or the like with the pitch of each sense amplifier or precharge circuit. Owing to the provision of each sense amplifier SA, one sense amplifier can be placed within a pitch twice that of each complementary bit line.

Figure 8:
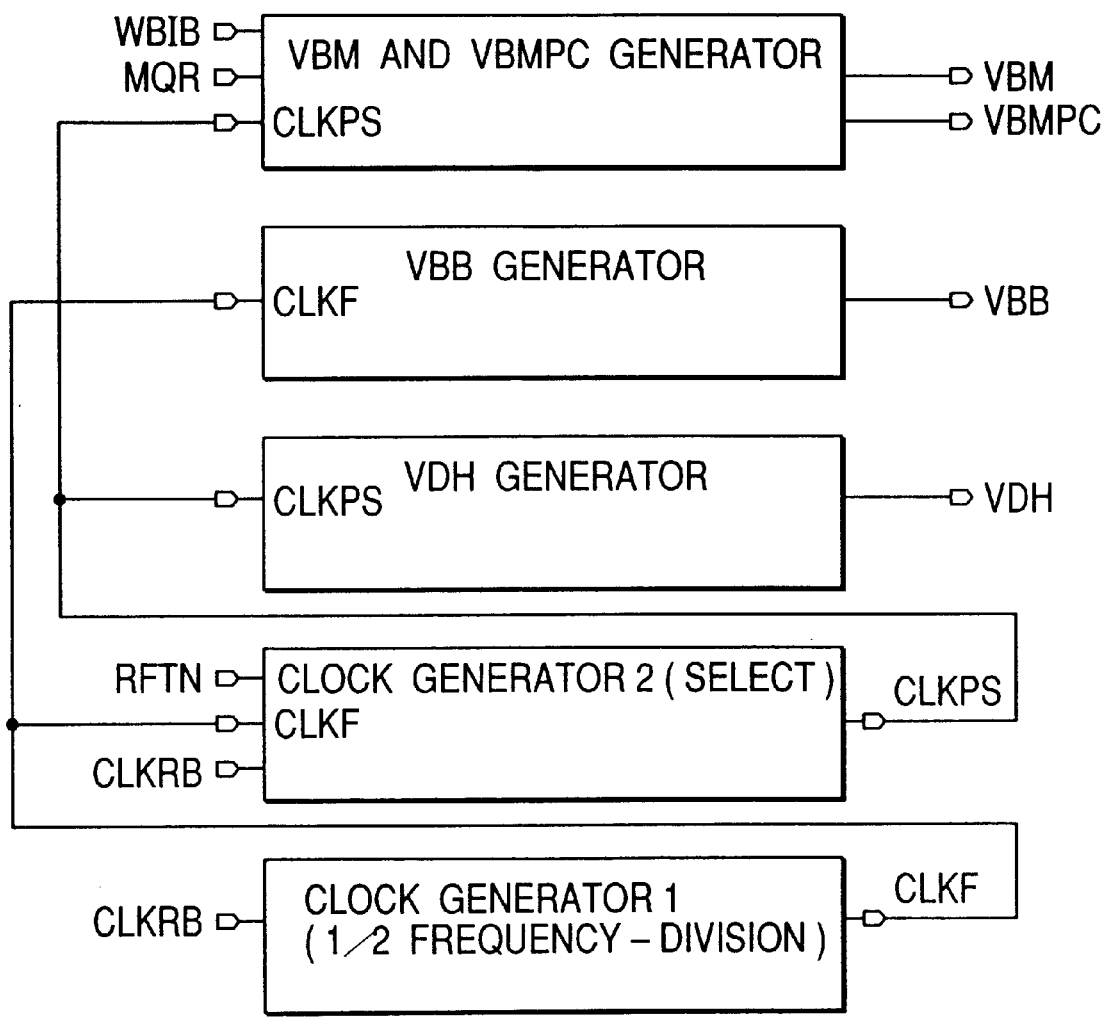
FIG. 8 is a block diagram illustrating one embodiment of a power circuit shown in FIG. 3.

FIG. 8 is a block diagram showing one embodiment of the power circuit VC illustrated in FIG. 1. The power circuit VC according to this embodiment produces or forms a boosted voltage VDH corresponding to the selection level of each word line referred to above, a substrate voltage VBB corresponding to a negative voltage, to be supplied to a P-type well region in which memory cells are formed, a plate voltage VBMPC (above VPL) to be supplied to the common electrode for the storage capacitors of the memory cells, and a precharge voltage VBM used for each complementary bit line.

The boosted voltage VDH and the substrate voltage VBB are produced or formed from a VDH generator and a VBB generator each comprised of a charge pump circuit. The plate voltage VBMPC and the precharge voltage VBM are formed by a VBM/VBMPC generator for substantially dividing the source voltage Vdd into 1/2. When an internal circuit is set to a voltage obtained by reducing the source voltage Vdd, for example, when the source voltage Vdd is brought to 3.3V and an operating voltage for a peripheral circuit such as a sense amplifier, an address selection circuit or the like is set to a voltage VDL reduced like 2.2V, the plate voltage VBMPC and the precharge voltage VBM are respectively set to a voltage like the internal voltage VDL/2=1.1V.

The power circuit VC is provided for the above-described RAM module. In the above-described RAM module, the memory mats selected according to the bank configurations are provided so as to differ in number. When each one is selected from the respective memory mats, the corresponding word line to which a number of memory cells are electrically connected, is brought to a boosted voltage. Thus, when the number of memory mats assigned to one bank increases, a word line drive current required to bring one word line to a selection level for each memory mat increases.

There is no problem in the operation if such current supply capability as to allow the driving of each word line employed in the maximum number of memory mats per bank is set as the power circuit VC. However, the boost voltage circuit is used to form or produce a voltage obtained by boosting the source voltage Vdd by use of the charge pump circuit, and uses up or consumes current to form the boosted voltage. Thus, when the word lines for the maximum number of memory mats are driven, needless to say, the current consumption will increase when the number of memory mats per bank is less than or equal to the maximum number of the memory mats.

In the present embodiment, when the number of memory mats per bank is switched to 1 or 2 as in the embodiment shown in FIG. 5, correspondingly, the current supply capability of the VDH generator is changed over according to the bank configurations as in the case of 1 or 2, whereby less power consumption is achieved. In the present embodiment, the frequency of a pulse CLKPS supplied to the VDH generator comprised of the charge pump circuit is varied upon switching of the current supply capability referred to above.

The above-described frequency switching is implemented by clock generators 1 and 2. That is, the clock generator 1 is a ½ frequency divider and divides the frequency of a clock signal CLKRB into ½ to thereby generate a 1/2-divided frequency signal CLKF. The clock generator 2 is a selector and selects either one of the input clock signal CLKRB or the divided clock signal CLKF in response to the control signal RFTN for performing switching to the bank configurations to thereby generate an output clock signal CLKPS.

The clock signal CLKPS outputted from the clock generator 2 is transferred to the VDH generator and the VBM/VBMPC generator. The VBB generator is steadily supplied with the divided clock CLKF of the clock generator 1. The clock signal CLKRB is a clock signal supplied from the outside of the RAM module and makes use of a system clock employed in a digital information processing circuit equipped with the RAM module.

The RAM module according to the present embodiment inputs and outputs data in synchronism with the clock signal CLKRB as in the case of the conventional synchronous DRAM or a DRAM placed under LAN-bus specifications. Therefore, the updating of each column-system address is performed in synchronism with the clock signal CLKRB. Such synchronous operation based on the clock signal CLKRB allows simple implementation of read/write operations based on the above-described pipeline operation using the plurality of banks.

When the control signal RFTN for designating each bank configuration is at a low level (logic 0), one bank comprises one memory mat. Since the corresponding word line is selected for one memory mat alone during one cycle of the clock signal CLKRB with such a bank configuration, the clock signal CLKF frequency-divided by the clock generator 1 is selected by the clock generator 2 and outputted therefrom. Thus, the VDH generator performs a charge pump operation in synchronism with the clock signal CLKF set to the low frequency and is hence set so as to have current supply capability consistent therewith.

When the control signal RFTN for specifying each bank configuration is at a high level (logic 1), one bank comprises two memory mats. Since the corresponding word lines for the two memory mats are simultaneously selected during one cycle of the clock signal CLKRB with such a bank configuration, the input clock signal CLKRB is selected by the clock generator 2 and outputted therefrom. Thus, the VDH generator performs a charge pump operation in synchronism with the clock signal CLKRB set to a high frequency corresponding to twice the above frequency and is hence set so as to have current supply capability corresponding to twice the current supply capability referred to above.

Since the current supply capability of the VDH generator is changed over according to such a bank configuration, in other words, in accordance with the number of memory mats in which the word lines are simultaneously activated, the current to be used up or consumed by the VDH generator can be controlled to the minimum required. In the RAM module according to the present embodiment as described above, a load such as a clock signal CLKR or the like for driving each memory mat, which is provided in the control circuit, is also switched according to the bank configuration. Further, such consideration as to provide flexible correspondence in association with the number of memory mats mounted while circuit standardization is being made, is given in the RAM module.

When the digital information processing system equipped with the RAM module is brought to a non-operating state itself, the clock signal CLKRB is caused to stop. There fore, the VDH generator and the VBB generator are also deactivated so that the RAM module will not substantially consume current. In this case, since the circuit for dividing the source voltage Vdd into ½ or the circuit for forming the deboosted voltage VDL, and the circuit for dividing it into ½ have dc current paths respectively, the dc current paths are cut off by a control signal MQR generated according to the non-operating state of the digital information processing system itself equipped with the RAM module, so that the VBM/VBMPC generator is also brought to a deactivated state.

Figure 9:
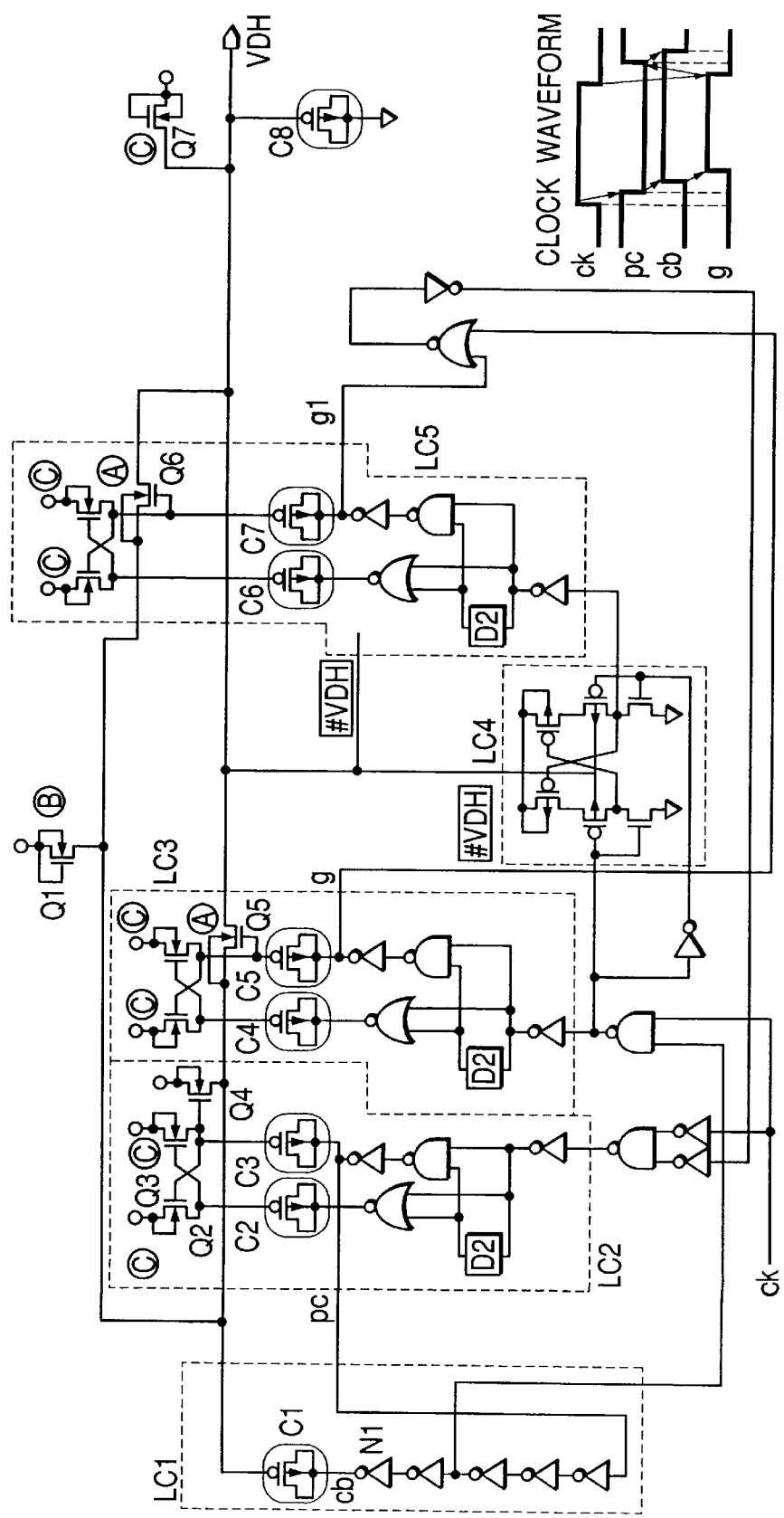
FIG. 9 is a circuit diagram depicting one embodiment of a VDH (boosted voltage) generator.

FIG. 9 is a circuit diagram showing one embodiment of the VDH generator. In the drawing, circuit symbols given to respective circuit elements partially overlap with those used in FIG. 6 and the like to make it easy to see the drawing. However, it should be understood that they have different circuit functions respectively. Further, P channel-type MOSFETs are distinguished from N channel-type MOSFETs by putting ○ indicative of low levels being active levels to their gate portions. While the N channel-type MOSFETs can be formed in the same P-type well region in a CMOS circuit, N channel-type MOSFETs marked with A through C in the drawing are respectively electrically isolated from each other by being formed in another P-type well region. Thus, a triple well structure is provided wherein an N-type well region DWLL is formed at a far depth on a P-type substrate, and a P-type well region PWELL is formed within the DWLL, whereby the N channel-type MOSFETs are formed.

The VDH generator according to the present embodiment has been contrived so that an internal voltage does not reach greater than or equal to 2 Vdd in consideration of a low withstand voltage of each micro-fabricated MOSFET in addition to such a contrivance as to form the boosted voltage VDH under a low source voltage Vdd with efficiency. In the present embodiment, a booster circuit comprises a combination of two circuits.

A circuit LC1 is a circuit for producing or forming a boosted voltage by a capacitor C1 utilizing the gate capacitance of a P channel-type MOSFET and an inverter N1 constituting its driver circuit or driver. MOSFETs Q1 and Q4 are provided as a precharge circuit at a node on the boost side of the capacitor C1. When a signal cb outputted from the inverter N1 constituting the driver is of a low level, the capacitor C1 is precharged by the MOSFETs Q1 and Q4. When the output signal cb changes from the low level to a high level, a precharge voltage is added to a high level like a source voltage Vdd outputted from the inverter N1 at the capacitor C1 to form a boosted voltage.

The MOSFET Q1 is an N channel-type MOSFET. However, the use thereof is different from the normal use in which the source voltage Vdd and its gate are electrically connected to its channel region (P-type well). When the output signal cb is low in level, the MOSFET Q1 is supplied with a precharge current due to a PN junction between the channel region and its source. However, a level loss will be produced from the MOSFET Q1 by a forward voltage at the PN junction, thus causing poor efficiency. Therefore, the MOSFET Q4 is utilized. Although the MOSFET Q4 is also basically similar to the MOSFET Q1, a boosted voltage set to greater than or equal to the source voltage Vdd formed by a capacitor C2 is applied to the gate thereof. As a result, it serves as a MOSFET and is brought to an on state. Thus, the source voltage Vdd can be substantially transferred to the capacitor C1.

A circuit LC2 is a boost voltage circuit comprised of a combination of two charge pump circuits and is used for driving of the MOSFET Q4. The two capacitors C2 and C3 thereof are supplied with non-overlap complementary pulses by a NAND gate circuit, a NOR gate circuit and an inverter, and a delay circuit D2. N channel-type MOSFETs Q2 and Q3 connected in latch form are provided at nodes on the boost sides of the capacitors C2 and C3.

When the input-side node of the capacitor C2 is low in level, a boosted voltage is formed or produced by the capacitor C3 to thereby turn on the MOSFET Q2 so as to supply the source voltage Vdd to the capacitor C2. At this time, the boosted voltage is applied even to the gate of the MOSFET Q4 and hence a precharge operation is performed on the capacitor C1. After the input node of the capacitor C3 is rendered low in level, the input node of the capacitor C2 is brought to a high level, so that a boosted voltage is formed at the output side of the capacitor C2. Thus, the MOSFET Q3 is turned on to short-circuit between the gate and source of the MOSFET Q2, whereby the MOSFET Q2 is turned off to prevent the boosted voltage of the capacitor C2 from escaping into the source voltage Vdd side and to perform the prechagre operation on the capacitor C3.

A circuit LC3 is configured as one basically identical to the circuit LC2. A MOSFET Q5 controlled thereby is used to output the boosted voltage produced or formed by the capacitor C1 without having to perform the precharge operation on the capacitor C2 as in the circuit LC2. Thus, the circuits LC2 and LC3 are driven by the non-overlap complementary pulses. That is, as indicated by a waveform diagram, a pulse signal pc and a signal g on the input sides, which are used to form the boosted voltages for the MOSFETs Q4 and Q5, are non-overlapped in antiphase with each other as indicated by the waveform diagram. In this configuration, the boosted voltage formed by each of the capacitors C1 through C3 can be controlled low to twice the source voltage Vdd at the maximum. Therefore, the circuit can be comprised of low withstand-voltage MOSFETs under device micro-fabrication.

Since circuits LC4 and LC5 are additionally provided in the present embodiment to form the original boosted voltage, in other words, because only the booster circuit like the circuit LC3 encounters difficulties in obtaining a sufficient boosted voltage in a low region of the source voltage Vdd. The circuit LC4 is a level converter for level-converting a pulse signal formed based on the source voltage Vdd into a voltage corresponding to each of the boosted voltages formed by the circuits LC1 through LC3. That is, the circuit LC5 performs a charge pump operation utilizing the boosted voltage formed by the circuit LC3 without being activated by such a source voltage Vdd as employed in the circuit LC3.

As a result, the levels of pulse signals at input-side nodes of capacitors C6 and C7 are respectively set to the boosted voltage formed by the booster circuit LC3 in the circuit LC5. Therefore, a gate voltage of a MOSFET Q6 can be raised. That is, since the MOSFET Q5 produces a level loss by its threshold voltage, it is hard to obtain a sufficient boosted voltage as described above. However, since a higher voltage utilizing the boosted voltage VDH is applied to the gate of the MOSFET Q6, the voltage formed by the capacitor C1 can be outputted as an output boosted voltage VDH with efficiency.

The circuits LC3 and LC5 are simultaneously activated. However, the circuit LC3 forms a boosted voltage VDH immediately after power-on and the circuit LC5 becomes dominant over its boosting operation when the boosted voltage VDH increases to some extent, and allows it to reach up to an intended or target boosted voltage. Although omitted in the drawing, the boosted voltage VDH is reduced or deboosted by a suitable level converter. If it is determined that the boosted voltage has reached a reference voltage corresponding to a desired voltage, then the supply of a clock signal CK is stopped. When, for example, the source voltage Vdd is set to 3.3V and the operating voltage VDL of the internal circuit is reduced to 2.2V as described above, the high level on the corresponding bit line is brought to 2.2V. Therefore, correspondingly, the boosted voltage is set to a boosted voltage VDH like 3.8V to which the effective threshold voltage of each address selection MOSFET is added.

Owing to the intermittent operation of each charge pump circuit referred to above, the boosted voltage VDH is controlled so as to reach a high voltage corresponding to the selection level of each word line described above. Further, a capacitor 8 is a capacitor for holding the boosted voltage VDH therein. A MOSFET Q7 is a MOSFET for performing chargeup on the capacitor C8 through a PN junction between its substrate and the source and drain thereof upon power-on. The MOSFET Q7 is turned off when the above-described boosting operation is started.

Referring to FIG. 1, an input/output interface unit will be explained as follows. An address terminal Add is constructed so as to transmit low address signals comprised of signals AX0 through AX7 used to select word lines in banks (memory mats), column address signals comprised of signals AY0 through AY2 used for column selection, bank address signals comprised of signals AR0 through AR3, for specifying row-system bank addresses, and bank address signals comprised of signals AC0 through AC3, for specifying column-system bank addresses.

A command terminal Com is constructed so as to transfer a clock signal CLK for inputting mask clocks, a control signal CR indicating that the corresponding cycle is a row-system command input, a control signal BA for providing instructions as to whether the corresponding bank should be activated or deactivated, a control signal CC indicating that the corresponding cycle is a column-system command input, and a control signal RW for providing instructions as to reading or writing. Further, a control signal MQ for stopping the operation of a RAM module internal circuit and a control signal RES for initializing an internal register are provided as special control signals. In addition to these, there are also provided control signals ME0 through ME7 for masking the input/output in byte units as described above, and testing control terminals Row-system commands are as follows:

(1) No Operation (NOP)

This command (NOP) is designated or specified by a low level (="0") of the signal CR on the leading edge of the clock signal CLK. Although the command is not an execution command, a row-system internal operation is continued.

(2) Bank Active (BA)

This command (BA) is specified by a high level (="1") of the signal CR and a high level (="1") of the signal BA on the leading edge of the clock signal CLK. X address signals AX0 through AX7 and row bank addresses AR0 through AR3 are designated by the command. A corresponding bank (memory mat) specified by such row bank addresses is rendered active and hence a corresponding word line specified by the X address signals AX0 through AX7 is brought to a selected state and a sense amplifier SA is activated. This command (BA) is equivalent or corresponds to the rising edge of a RAS (Row Address Strobe) at a high level of /CAS (Column Address Strobe) signal in a general purpose DRAM. That is, a row-system selecting operation is performed and the specified bank performs a refresh operation on each memory cell connected to the selected word line.

(3) Bank active Close (BC)

This command (BC) is designated by the high level (="1") of the signal CR and a low level (="0") of the signal BA on the rising edge of the clock signal CLK. The X address signals AX0 through AX7 are ignored by this command and the corresponding bank specified by the row bank addresses AR0 through AR3 is precharged. That is, each selected word line is brought to a non-selected state and the sense amplifier SA is deactivated, whereby each complementary bit line and a common source line for the sense amplifier, or the like are brought to a half precharge potential Column-system commands are as follows:

(4) No Operation (NOP)

This command (NOP) is specified by a low level (="0") of the signal CC on the leading edge of the clock signal CLK. Although the present command is not an execution command, a column-system internal operation is continuously performed.

(5) Read (RD)

This command (RD) is specified by a high level (="1") of the signal CC and a high level (="1") of the signal RW on the leading edge of the clock signal CLK. Y address signals AY0 through AY3 and column bank addresses AC0 through AC3 are specified by the present command. A bank (memory mat) specified by such row bank addresses is rendered active so that each column switch specified by the Y address signals AY0 through AY3 is turned on. Thus, the above-described 128 pairs of complementary bit lines are connected to their corresponding global bit lines GBD, and a read amplifier RA and an output buffer are activated. This command (RD) is equivalent or corresponds to a high level of /WE (Write Enable) signal upon a low level of a /RAS (Row Address Strobe) signal and on the falling edge of a /CAS (Column Address Strobe) signal in the general purpose DRAM. If a signal CME is of a high level (="1"), then the output buffer is brought to a high impedance state after the completion of reading. If the signal CME is of a low level (="0"), then the output buffer is brought to an operating state and hence continues the above-described output operation until the next read signal is outputted.

(6) Write (WT)

This command (WT) is specified by the high level (="1") of the signal CR and a low level (="0") of the signal RW on the leading edge of the clock signal CLK. Y address signals AY0 through AY3 and column bank addresses AC0 through AC3 are specified by the present command. A bank (memory mat) specified by such row bank address signals AY0 through AY3 is rendered active so that a column switch designated by the Y address signals AY0 through AY3 is turned on. Thus, the above-described 128 pairs of complementary bit lines are electrically connected to their corresponding global bit lines GBD. Further, an input buffer is activated to take in or capture write data, and a write amplifier is activated to perform a writing operation. This command (WT) corresponds to a low level of the /WE (Write Enable) signal upon the low level of the /RAS (Row Address Strobe) signal and on the falling edge of the /CAS (Column Address Strobe) signal.

In the read or write command, input/output data can be masked using signals BE0 through BE15. That is, 128 bits are divided into 16 bytes according to the signals BE0 through BE15 to allow masking in byte units. When a signal BEi (where i=0 to 15) is brought to a high level (="1") upon read, the output results in low impedance to allow the output of the corresponding byte i. When the signal BEi (where i=0 to 15) is brought to a low level (="0"), the output is brought to high impedance so that the output of the corresponding byte i is masked. When the signal BEi (where i=0 to 15) is set to the high level (="1") upon write, data is written. When the signal BEi (where i=0 to 15) is brought to the low level (="0"), data is not written and the previous data is held (refreshed) in the selected memory cell.

Figure 10:
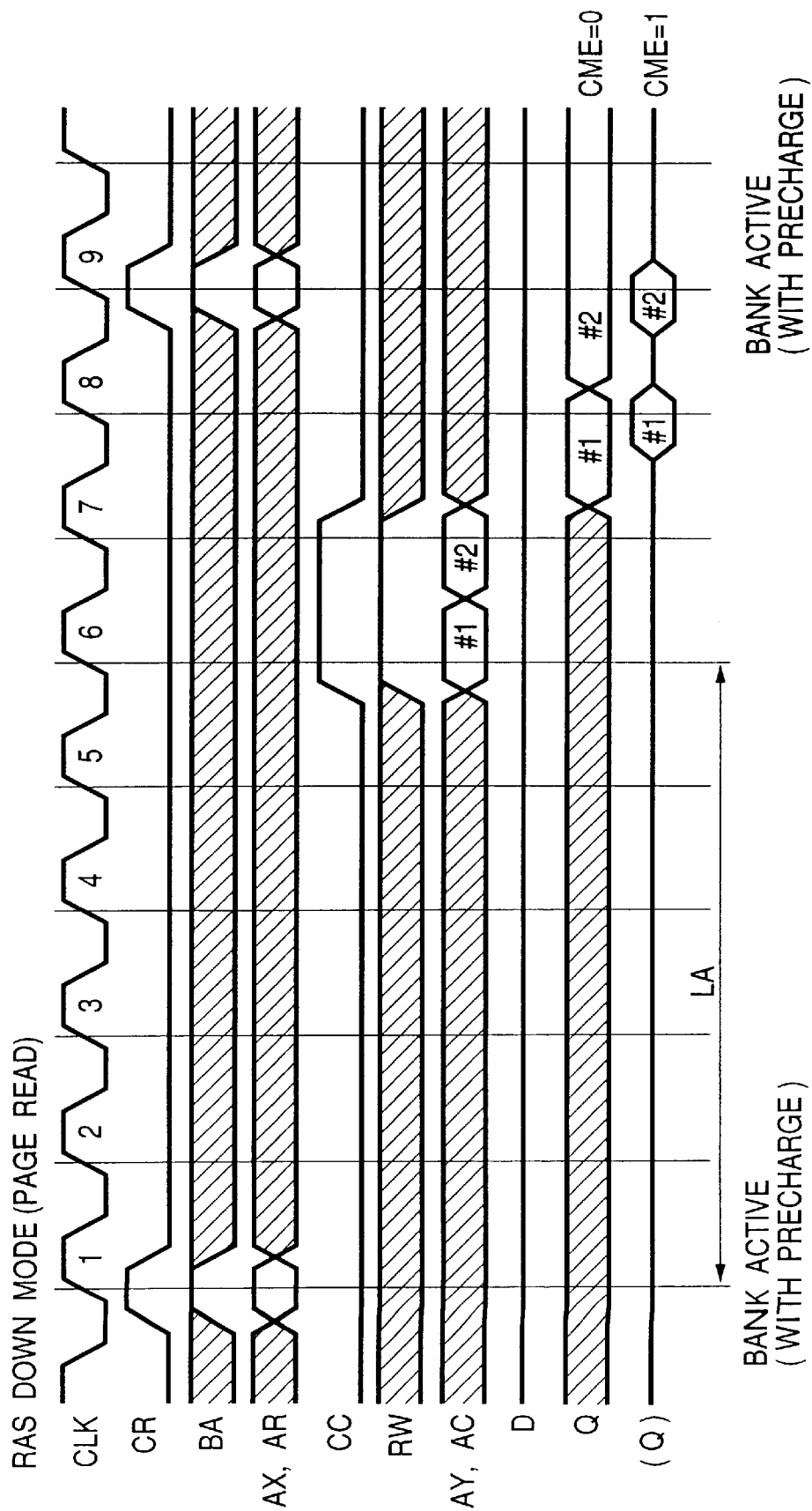
FIG. 10 is a timing chart for describing one example of the operation of the RAM module according to the present invention.

FIG. 10 is a timing chart for describing one example of the operation of the RAM module according to the present invention. A RAS down mode (page read) is illustrated in the drawing by way of example.

The bank active command (BA) is executed in a first cycle of the clock CLK. The rasdown (RAS down) mode indicates an operation in which the bank active close (BC) is not executed before its execution. In the specified bank (memory mat), the corresponding word line is selected and the corresponding sense amplifier remains at an activated state. Therefore, the bank active close (BC) is automatically executed for the corresponding bank in the RAS down mode. Two first and second cycles are spent to execute the bank active close (BC). Thus, the bank active command (BA) is executed from a third cycle. That is, a word-line selecting operation and a sense-amplifier amplifying operation are executed using three cycles (3 to 5) of the clock signal CLK at the corresponding memory mat set by the designated bank addresses. In order to ensure the above-described operating time, the second to fifth cycles of the clock signal CLK are defined as the no-operation (NOP) command.

In a sixth cycle of the clock signal CLK, a read command (RD) is inputted to specify a first column address #1. Thereafter, a read signal #1 corresponding to the first column address #1 is outputted with a delay of two clocks. In the synchronous DRAM according to the present embodiment, CAS latency is set to 2. That is, two clocks are spent between the input of a column address and the output of data corresponding to it.

In the page mode, the signal CC is maintained at a high level. Further, the following column addresses AY and AC are inputted in synchronism with the clock signal CLK and the switching between the column switches is performed according to the input column addresses AY and AC. Therefore, data synchronized with the clock signal CLK can be sequentially read. The same drawing shows an example in which two data are sequentially read. Since, however, the column switches are provided as eight sets or pairs described above when one memory mat is taken per bank a, sequential read is allowed over eight cycles at maximum. When two memory mats are assigned per bank a, sequential read is permitted over sixteen cycles at maximum. In a ninth cycle, the second data #2 is outputted and a command for a bank active (BA) similar to above is issued simultaneously with this, after which the following row address is selected.

Figure 11:
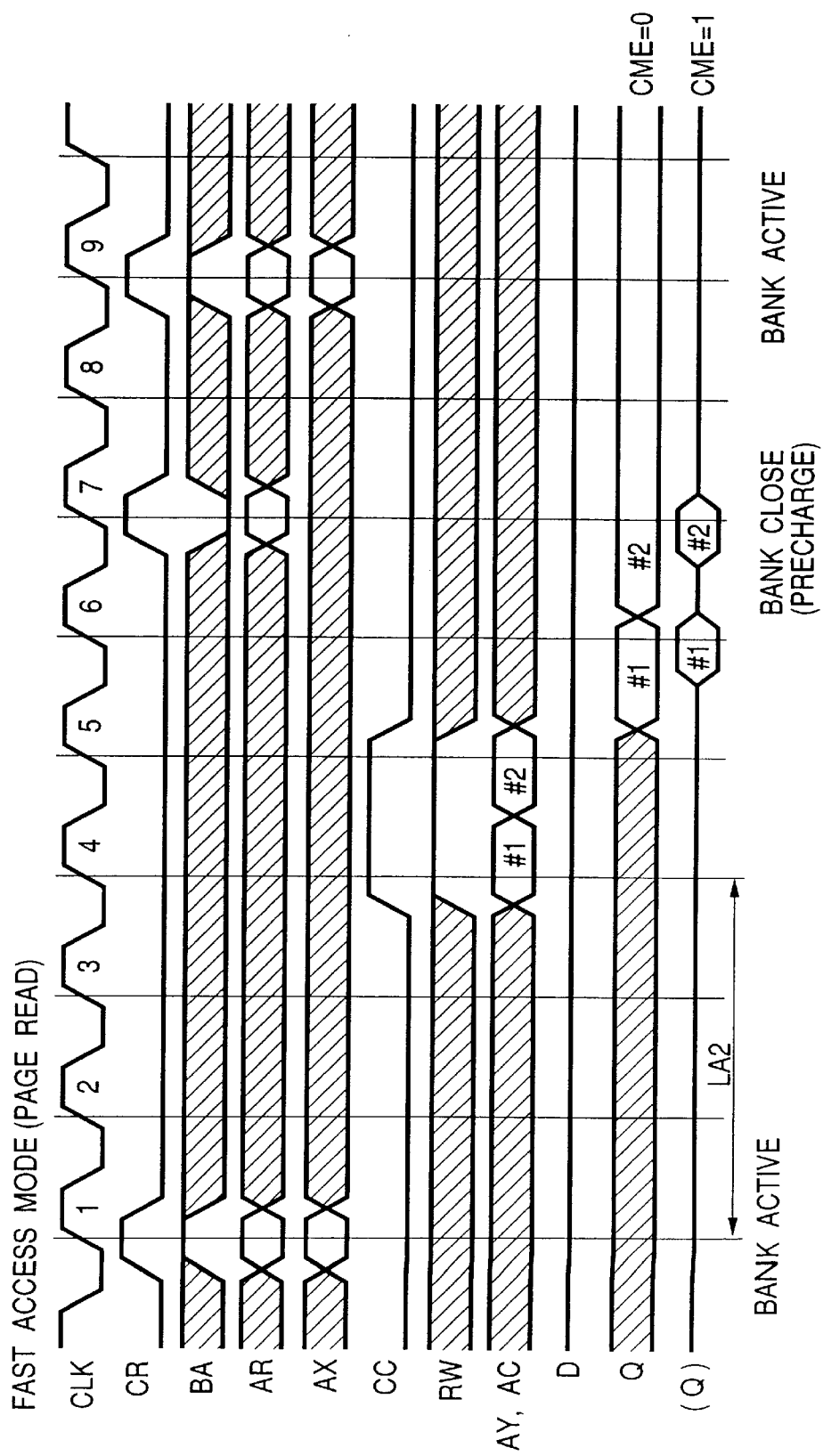
FIG. 11 is a timing chart for describing another example of the operation of the RAM module according to the present invention.

FIG. 11 is a timing chart for describing another example of the operation of the RAM module according to the present invention. The same drawing shows an example of a fast mode (page read).

This fast (Fast) mode is based on the premise that the bank active close (BC) has been executed before the present mode. A bank active (BA) command specified in a first cycle of a clock CLK is executed from a first cycle, i.e., a word-line selecting operation and a sense-amplifier amplifying operation are executed using three cycles (1 to 3) of the clock signal CLK at the designated memory mat based on the bank addresses. In order to ensure the above-described operating time, the second to third cycles of the clock signal CLK are defined as the no-operation (NOP) command.

In a fourth cycle of the clock signal CLK, a read command (RD) is inputted. In this command, a first column address #1 is specified in the same manner as described above, and a read signal #1 corresponding to the first column address #1 is outputted with a delay of two clocks. In the page mode in the same manner as described above, the signal CC is maintained at the high level. Further, the following column addresses AY and AC are inputted in synchronism with the clock signal CLK and the switching between the column switches is performed according to the input column addresses AY and AC. Therefore, data synchronized with the clock signal CLK can be sequentially read.

FIG. 11 shows an example in which two data are sequentially read. Since, however, the column switches are provided as eight sets or pairs described above when one memory mat is taken per bank a, sequential read is allowed over eight cycles at maximum. When two memory mats are assigned per bank a, sequential read is permitted over sixteen cycles at maximum. In the fast mode, the bank active close (BC) is inputted in a seventh cycle when the second data #2 is outputted as shown in the drawing, and thereafter two cycles are spent to execute a precharge operation. Thus, the input of a bank active command for the next reading is taken in a ninth cycle.

In the RAS down mode, bank active close (BC) commands are not issued successively and banks in which read data exist, may be simply specified arbitrarily. Therefore, it is easy-to-use. Conversely, however, a time interval LA1 between the input of the bank active (BA) and the output of data occupies 6 cycles. On the other hand, the fast mode brings about an advantage in that, although it has the inconvenience of successively issuing the bank active close (BC) commands to the corresponding banks after the completion of required reading (or writing) of data, a time interval LA2 between the input of each bank active (BA) and the output of data can be made faster like four cycles. Thus, either one of the modes to be used can be most suitably selected according to the type of data or the procedure for processing data.

Figure 12:
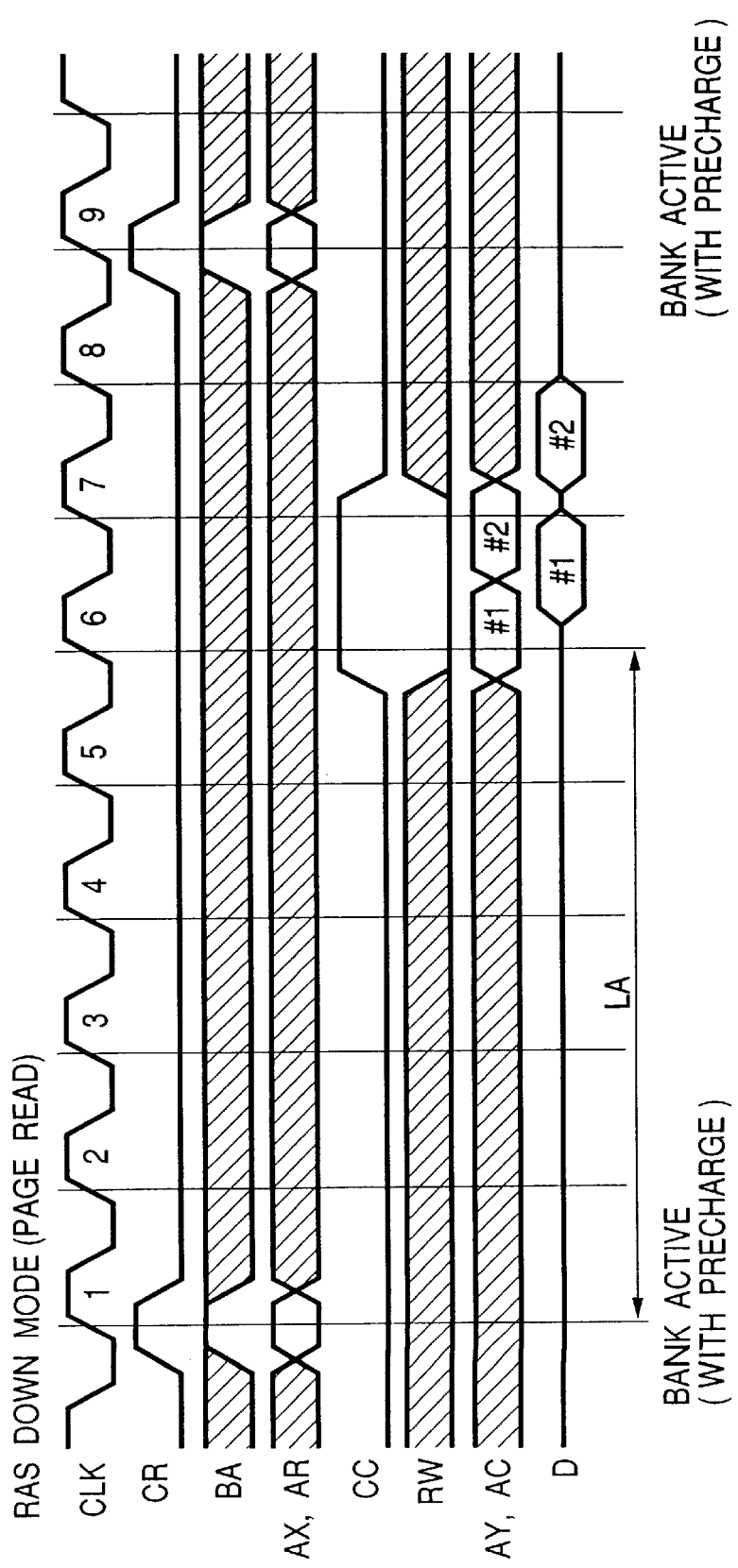
FIG. 12 is a timing chart for describing a further example of the operation of the RAM module according to the present invention.

FIG. 12 is a timing chart for describing a further example of the operation of the RMA module according to the present invention. The same drawing shows an example of a Ras down mode (page write).

The page write operation is basically similar to the page read operation shown in FIG. 10. However, the page write operation is simply changed to an operation wherein a command inputted in a sixth cycle is set as a write command (WT) in place of the read command (RD) and write data D is inputted correspondingly and written into its corresponding memory cell by a write amplifier.

Figure 13:
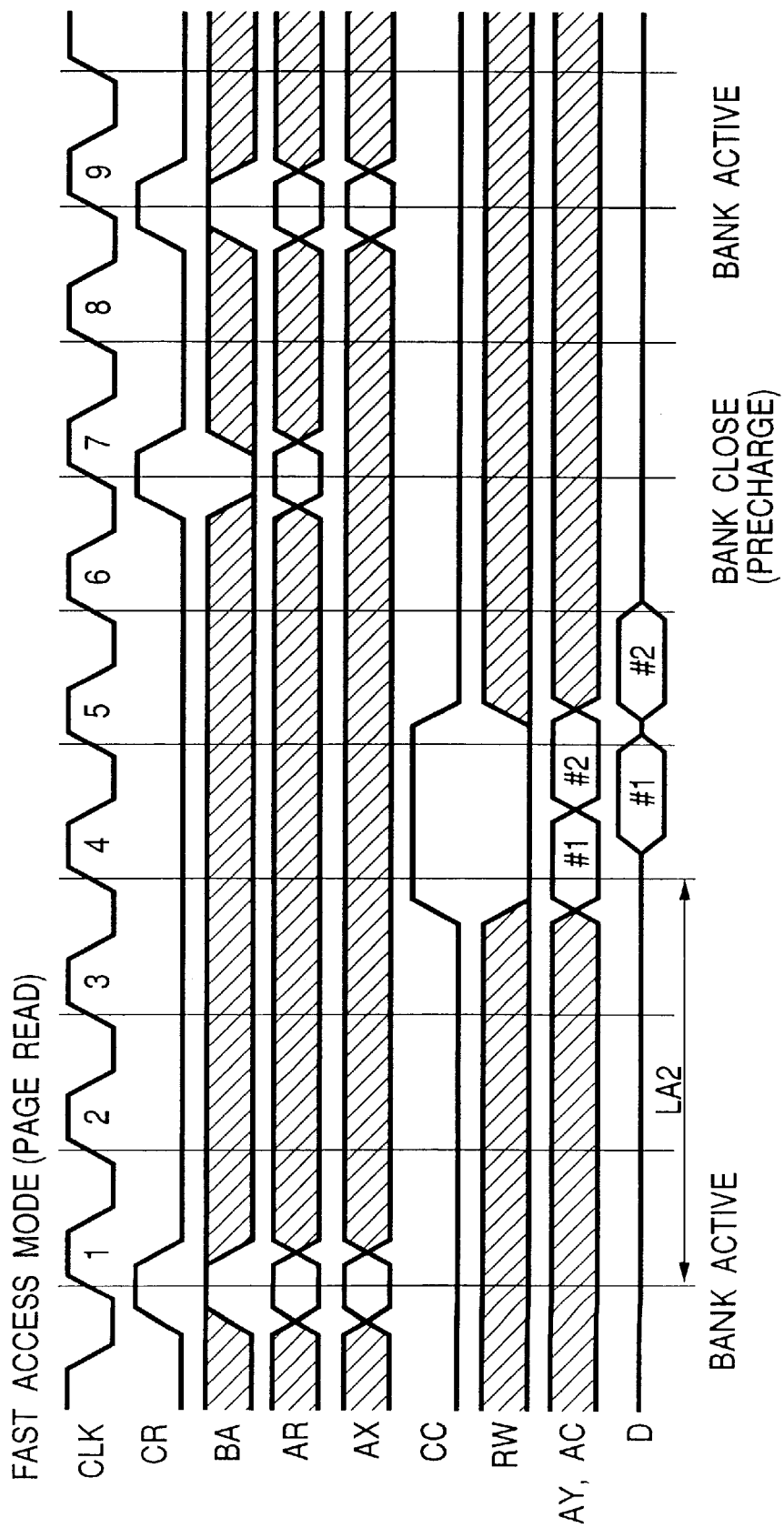
FIG. 13 is a timing chart for describing a still further example of the operation of the RAM module according to the present invention.

FIG. 13 is a timing chart for describing a still further example of the operation of the RAM module according to the present invention. The drawing illustrates an example of a Fast mode (page write).

The page write operation is basically similar to the page read operation shown in FIG. 11. However, the page write operation is simply changed to an operation wherein a command inputted in a fourth cycle is set as a write command (WT) in place of the read command (RD) and write data D is inputted correspondingly and written into its corresponding memory cell by a write amplifier.

FIGS. 12 and 13 respectively show examples in which two data are sequentially written. However, since the column switches are provided as eight sets as described above when one memory mat is taken per bank a, sequential write is permitted over eight cycles at maximum. When two memory mats are assigned per bank a, sequential write is allowed over sixteen cycles at maximum. The combination of the signals BEi allows masking in byte units. A mask function using such signals BEi is the same even in the read mode referred to above.

In the bank control system, the respective banks are activated separately from each other, and activation/deactivation and reading/writing are performed for all banks. In order to continuously issue the bank active commands (BA) to the same bank, two clock intervals are needed even at optimum to perform the Ras down mode. That is, the previous BA command is rendered invalid by a Ras down function based on the subsequent BA command. Due to the constraints of bus conflicts, read/write commands must not be issued simultaneously to a plurality of banks. Under such conditions, a plurality of banks are successively designated and the input/output of continuous data by the pipeline operation is allowed. The control system of such a type that control on the respective banks is performed based on the bank active commands (BA) and the bank active close command (BC), is deemed to become complicated at first view, but will exhibit the greatest effect on the input/output of data with arbitrary necessary timing. That is, so long as the bank active command (BA) is issued, the corresponding bank maintains that condition. Further, if the read (RD) or write (WT) command referred to above is issued with necessary timing, then the input/output of data can be immediately executed. Therefore, this will be useful for a pipeline operation using a plurality of banks. In the present embodiment, a plurality of cycles are needed according to the data processing time or precharge time or the like. However, they are required to provide a high-speed operation. The number of the cycles is not limited to this upon a low-speed operation.

Although the dynamic memory cell is used in the present embodiment, it has no refresh-dedicated command and does not have even a refresh control circuit. The reason for that is that consideration has been given to the case where the number of memory mats in the RAM module itself is set according to the storage capacity and a plurality of RAM modules themselves are provided. That is, this is because when refresh control circuits are provided for a plurality of RAM modules, they are provided in a semiconductor integrated circuit device so as to overlap upon mounting of the RAM modules, thus causing the risk of producing waste.

In the present embodiment, the refresh control circuit is configured so as to be provided outside the RAM module. Owing to this configuration, the refresh control circuit can be commonly used even upon mounting of a plurality of RAM modules. Since the row-system selecting operation and the column-system selecting operation are independently performed in the RAM module as described above, the refresh control circuit may perform a refresh operation so as to issue a refresh address, a bank active command (BA) and a bank active close command (BC).

If the semiconductor integrated circuit device equipped with the RAM module according to the present embodiment is brought to a state of having been supplied with the source voltage and a standby state of having no operation, then it has a full standby or super standby mode in which all the circuit operations thereof are stopped inclusive of the refresh operation and no current flows. The control signal MQ is utilized to set such a mode. When the signal MQ is activated, the RAM module is set so that no dc current flows even through the charge pump circuit constituting the power circuit VC and the divider for forming the half precharge voltage or plate voltage. Thus, if stored data to be held exists, then a static RAM is mounted and thereafter the data stored in the dynamic RAM may be saved into the static RAM immediately before the full standby or super standby mode.

In the RMA module according to the present embodiment, the column-system and row-system selecting operations are separately performed for each of the banks as described above. That is, a corresponding memory bank is held in the active state unless the bank active close (BC) is issued as described above. Therefore, a reset function is additionally provided because the checking of whether each memory bank is in the active state and the designation of the banks one by one to issue the bank active close (BC) become troublesome. That is, a function is additionally provided in which when the control signal RES is rendered active, a register held in an operating state is reset, in other words, the selecting operations are reset in each individual memory mat so that they automatically go into a precharge operation and are thereafter brought to the closed state.

Figure 14:
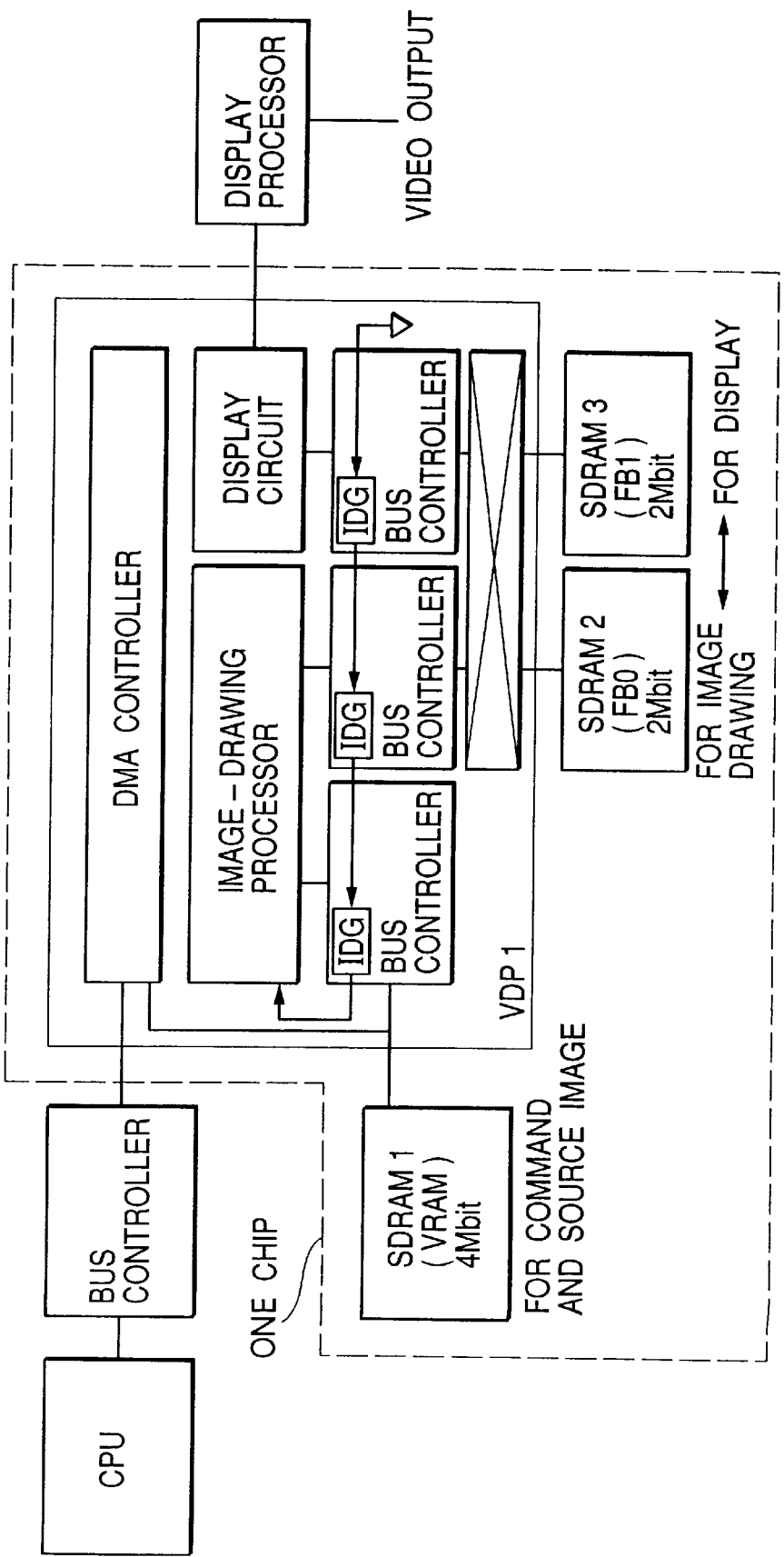
FIG. 14 is a block diagram showing one embodiment of a semiconductor integrated circuit device equipped with a RAM module according to the present invention.

FIG. 14 is a block diagram showing one embodiment of a semiconductor integrated circuit device equipped with the RAM module according to the present invention. Respective circuit blocks illustrated in the drawing are formed on a single semiconductor substrate like monocrystalline silicon by a known semiconductor integrated circuit fabrication technique.

The semiconductor integrated circuit device according to the present embodiment is intended for data processing like 3D graphic processing and can be used as a graphic rendering LSI employed in a home game machine. The present embodiment comprises SDRAMs (Synchronous Dynamic RAMs) comprised of 8M bits in total, which are made up of 4M bits used for a command and a source image and 2×2M bits respectively used for display and image drawing, an image-drawing processor comprised of about 50 thousand of gates, a DMA controller, a bus controller and a display circuit.

The SDRAM comprises a combination of such RAM modules as illustrated in the aforementioned embodiments. For example, eight memory mats each comprised of about 256K bits are provided in combination as described above to construct display and image-drawing SDRAMs 2 and 3 each comprised of 2M bits. The sixteen 256K-bit memory mats referred to above are mounted to configure an SDRAM 1 comprised of about 4M bits and used for the command and source image.

The two SDRAMs 1 and 2 are alternately switched over for the image drawing and display on a time basis. When image data is read from one SDRAM 1 of the two SDRAMs in the case of an even frame=0, for example, and display data synchronized with raster scan timing of a display unit such as a CRT or the like is outputted through an external display processor by way of the bus controllers and the display circuit, the other SDRAM 2 is used for image drawing and writes image data to be updated therein. When the image data stored in the other SDRAM 2 of the two SDRAMs contrary to the above is read in the case of an odd frame=1, and display data synchronized with the raster scanning timing of the display unit such as the CRT or the like is outputted through the display processor by way of the bus controllers and the display circuit, the above one SDRAM 1 is used as for the image drawing and writes image data to be updated therein.

Owing to the alternate switching between the display operation and the image-drawing operation as described above, a short time interval corresponding to the displayed frame can be effectively utilized to draw and display 3D graphic images. Since it is necessary to read large quantities of data sequentially when the SDRAM is used as for the above-described display, the number of memory mats per bank is set to 2 and the number of data read sequentially by one memory access is set in large numbers. On the other hand, when the SDRAM is used for image drawing, the number of banks is set in large numbers to renew or reprogram a portion to be changed during the display operation period at high speed, and thereby a high-speed write operation based on pipeline processing is allowed. Since the switching between the bank configurations can be performed by the control signal RFTN as described above in the RAM module according to the present embodiment, an efficient memory operation corresponding to an operation mode thereof can be carried out.

This is similar even to the SDRAM 1 used for the command and source image. In order to capture program commands and source images read from a CD with gate programs or the like stored therein, for example, the number of memory mats per bank is increased so as to write large amounts of data therein at high speed. Upon the image-drawing operation, the number of banks is increased and only the required data is changed by the pipeline operation at high speed, whereby high-speed 3D graphic data can be created.

The bank address generators provided for the respective memory mats of the RAM module are respectively employed in self-identification circuits IDG of the bus controllers for controlling access to the SDRAM 1 through SDRAM 3. That is, adder circuits of the self-identification circuits IDG are electrically connected to each other in series form in a manner similar to the assignment of the bank addresses to the above-described memory mats and their corresponding self-identification addresses are assigned thereto. The corresponding bus controller is selected according to the comparison and coincidence with ID information from the image-drawing processor. That is, the selective memory access to the SDRAMs can be controlled through the bus controllers. In a one-chip microcomputer system or the like formed in the semiconductor integrated circuit device in this way, the assignment of addresses to peripheral circuits can be used in self-identification circuits IDG each using an adder circuit or a subtraction circuit similar to the above.

Operations and effects obtained from the aforementioned embodiments are as follows:

(1) An advantageous effect can be obtained in that a RAM mounted so as to mix with logic circuits has a configuration wherein one control circuit is commonly provided for a plurality of memory mats each including a memory array in which a plurality of memory cells are respectively placed at points where a plurality of word lines and a plurality of bit lines intersect, and an address selection circuit for performing selecting operations on the word lines and the bit lines, and adopts a configuration wherein the number of memory mats is determined according to the required storage capacity, arithmetic circuits for respectively performing +1 or −1 arithmetic operations are respectively provided in the memory mats and connected in cascade form and include a first-stage arithmetic circuit having an input terminal supplied with address-setting address signals formed as fixed or programmable, input signals supplied to the arithmetic circuits or signals outputted therefrom are defined as address signals assigned thereto, each of comparators makes comparisons for coincidence between the address signals and address signals inputted upon memory access, so that each memory mat activates an address selecting operation according to the coincidence signal, whereby standardized ones of the respective memory mats can be used and design management of the RAM module can be simplified.

(2) Another advantageous effect can be obtained in that flexible treatments corresponding to purposes can be taken by arbitrarily setting the number of the memory mats according to the required storage capacity used for the RAM module.

(3) A further advantageous effect can be brought about in that high integration and the formation into mass storage capacity can be achieved by utilizing as the memory array, a DRAM circuit comprising dynamic memory cells placed in matrix form, sense amplifiers each of which reads and amplifies information stored in a memory cell to be read into a bit line connected to the memory cells, a precharge circuit which precharges the potential on the bit line, and a column switch which connects the corresponding bit line to a global bit line provided commonly for the plurality of memory mats.

(4) A still further advantageous effect can be obtained in that each memory mat referred to above is provided with first and second determination circuits for respectively making comparisons for coincidence between bank address information comprised of binary information assigned to each memory mat and input bank address information, and validates X-system address signals used for a selecting operation of each word line or a result of decoding thereof, based on the first determination result and validates Y-system address signals used for a selecting operation of each bit line or a result of decoding thereof, based on the second determination result, and bits for address information, which correspond to the number of memory mats simultaneously activated with respect to the first determination circuit, are forcefully brought to a coincidence state, whereby the switching between bank configurations is allowed.

(5) A still further advantageous effect can be brought about in that an X-system address selection circuit for selecting each word line referred to above comprises a predecode circuit which divides X-system address signals into plural sets and predecodes the divided plural sets and an AND-configured row decoder which includes series-connected MOSFETs for receiving the predecode signals therein, and a word driver selects the corresponding word line in response to a word line selection signal formed by the row decoder, and the operation of the predecode circuit or row decoder is controlled based on the result of determination formed by the first determination circuit so that the corresponding word line selecting operation is performed by a selected memory mat alone, whereby the row-system selecting operation of each memory mat in accordance with the first determination result can be controlled.

(6) A still further advantageous effect can be obtained in that an overflow check circuit is further provided which compares the magnitudes of an input signal supplied to the arithmetic circuit corresponding to the final-stage memory mat of the plurality of memory mats connected in cascade form or an output signal produced therefrom and each address signal inputted upon the memory access, and the operation of a read amplifier for amplifying a read signal outputted from the corresponding memory mat is forcefully stopped according to an overflow detection signal detected by the overflow check circuit, and the overflow detection signal is transmitted to the outside of the RAM module, whereby needless current consumption produced in the read amplifier can be cut down and errors of operation can be previously prevented from occurring.

(7) A still further advantageous effect can be brought about in that the control circuit is provided with a detector which detects the number of mounted memory mats in response to a signal outputted from the final-stage memory mat of the plurality of memory mats connected in cascade form, and the control circuit adjusts or controls the load on each driver, which forms a control signal or a timing signal commonly supplied to the memory mats, so as to become substantially constant regardless of the number of the memory mats, whereby timing margins can be increased.

(8) A still further advantageous effect can be obtained in that each memory mat referred to above includes dummy load circuits provided in a path for transmitting the control signal or the timing signal, and the control circuit designates the number of the dummy load circuits mounted to the respective memory mats, which are connected to the respective memory mats, to thereby control the whole load on the driver so as to become substantially constant regardless of the number of the memory mats, whereby timing margins can be enlarged with a simple configuration because the dummy load circuits are dispersedly placed in the respective mats.

(9) A still further advantageous effect can be obtained in that the control circuit and a plurality of memory mats are arranged side by side in a straight line to form a RAM module, the arithmetic circuit in the memory mat provided at a position farthest from the control circuit is connected so as to be an initial-stage circuit, whereas the arithmetic circuit in the memory mat disposed adjacent to the control circuit is connected so as to be a final-stage circuit, and the overflow check circuit is provided in the control circuit or on the control circuit side, and a read amplifier for amplifying a read signal from each memory mat referred to above and a circuit for transmitting an overflow detection signal to an external circuit are placed in the control circuit, whereby the placement of circuits along the flow of signals is allowed and a reasonable circuit layout is achieved.

(10) A still further advantageous effect can be obtained in that a control circuit and a plurality of memory mats are arranged side by side in a straight line to construct a RAM module, the arithmetic circuit in the memory mat provided at a position farthest from the control circuit is placed so as to be an initial-stage circuit, whereas the arithmetic circuit in the memory mat disposed adjacent to the control circuit is placed so as to be a final-stage circuit, and the number-of-memory mats detector provided in the control circuit is supplied with a signal outputted from the final-stage arithmetic circuit, whereby the placement of circuits along the flow of signals is permitted and a reasonable circuit layout can be achieved.

(11) A still further advantageous effect can be obtained in that the control circuit is supplied with row-system and column-system address signals separately and allows each memory mat to perform row-system and column-system selecting operations in accordance with the separately-input row-system and column-system address signals, whereby a flexible memory selecting operation corresponding to the switching between bank configuration is allowed.

(12) A still further advantageous effect can be obtained in that the row-system and column-system address signals are synchronized with a clock signal supplied from the outside of the RAM module and are inputted together with control signals which provide instructions for the operations of row-system and column-system circuits, the address signals include address signals which specify one to plural memory mats to be selected by the corresponding word line, and the instructions for the operation of the row-system circuit include two types of a start of the row-system selecting operation and an operation end for providing instructions for a precharge operation after the completion of the row-system selecting operation, whereby the selecting operations with arbitrary timing can be implemented as in the case of a pipeline operation using a plurality of memory banks, for example.

(13) A still further advantageous effect can be obtained in that when the immediately preceding state of the row-system circuit is taken as the row-system selecting operation, the row-system circuit completes the previous operation and performs a precharge operation, and thereafter automatically performs a row-system selecting operation corresponding to the input address signals, whereas when the immediately preceding state thereof is given as the operation end state, the row-system circuit performs a row-system selecting operation corresponding to the input address signals, whereby easy-to-use memory access is allowed.

(14) A still further advantageous effect can be obtained in that the RAM module is provided with a reset input terminal and additionally provided with the function of forcefully terminating the row-system and column-system selecting operations when a predetermined reset signal is inputted to the reset input terminal, thereby bringing the selection circuit in each memory mat to a precharge state, whereby ease of operation under the bank control system can be improved.

(15) A still further advantageous effect can be obtained in that the RAM module is constructed such that in a state in which the semiconductor integrated circuit device is being supplied with a source voltage, the operation of each circuit is provided with the function of bringing it to a full standby state in which a current non-flowing state is held over a long time exceeding at least an information holding time of each memory cell, whereby reasonable memory control consistent with the operation of the semiconductor integrated circuit device is permitted and hence less power consumption can be implemented.

(16) A still further advantageous effect can be obtained in that one semiconductor integrated circuit device is equipped with a plurality of circuit blocks each having a specific circuit function, the respective circuit blocks are respectively provided with arithmetic circuits which perform +1 addition or −1 subtraction operates on address-setting input signals comprised of a plurality of bits, and comparators which respectively define input signals supplied to the arithmetic circuits or output signals produced therefrom as own-assigned address signals and respectively determine comparisons for coincidence between the input signals supplied to the arithmetic circuits or the output signals produced therefrom and external address signals, and the arithmetic circuits in the plurality of circuit blocks are connected in cascade form, an input terminal of the arithmetic circuit in the initial-stage circuit block is supplied with fixed address signals, and the corresponding circuit block in the respective circuit blocks is activated according to the coincidence signal, whereby the assignment of addresses to the circuit blocks provided in the semiconductor integrated circuit device can be simply achieved.

The invention, which has been made by the present inventors as described above, has been described specifically by the illustrated embodiments. However, the invention described in the present application is not necessarily limited to the aforementioned embodiments. It is needless to say that various changes can be made thereto within a scope not departing from the substance of the invention. For example, the storage capacity of a memory array provided in one memory mat can take various forms. The memory array may be one which adopts a shared sense amplifier system wherein sense amplifiers, a precharge circuit and a column switch are disposed in the center thereof and memory cells are provided on both sides thereof. A circuit ground potential other than the above-described substrate voltage VBB may be used in a semiconductor region in which dynamic memory cells are formed.

In this case, a so-called BSG (Boosted Sense Ground) system wherein a low level potential at each bit line is set higher than a circuit ground potential, may be adopted to reduce leakage currents developed in address selection MOSFETs at dynamic memory cells, in other words, to maintain an information holding characteristic of each memory cell. In place of this, a system may be used wherein a booster circuit is omitted by using the potential at each bit line as a voltage reduced by the threshold voltage of each address selection MOSFET from a source voltage and utilizing the source voltage as a selection level for each word line. Alternatively, a combination of the two proposals referred to above may be adopted. In doing so, the compatibility of a device process between a RAM module and each externally-provided CMOS logic circuit is improved and its simplification is attainable.

Each memory mat mounted to a RAM module may adopt a configuration which uses static memory cells other than the above-described dynamic memory cells. Alternatively, one may adopt an approach which utilizes cells such as nonvolatile memories, etc. This invention can be widely used in a semiconductor integrated circuit device equipped with a RAM module.

Effects obtained by a typical one of the features disclosed in the present application will be described in brief as follows: A RAM mounted so as to mix with logic circuits has a configuration wherein one control circuit is commonly provided for a plurality of memory mats each including a memory array in which a plurality of memory cells are respectively placed at points where a plurality of word lines and a plurality of bit lines intersect, and an address selection circuit for performing selecting operations on the word lines and the bit lines, and adopts a configuration wherein the number of memory mats is determined according to the required storage capacity, arithmetic circuits for respectively performing +1 or −1 arithmetic operations are respectively provided in the memory mats and connected in cascade form and include a first-stage arithmetic circuit having an input terminal supplied with address-setting address signals formed as fixed or programmable, input signals supplied to the arithmetic circuits or signals outputted therefrom are defined as address signals assigned thereto, each of comparators makes comparisons for coincidence between the address signals and address signals inputted upon memory access, so that each memory mat activates an address selecting operation according to the coincidence signal, whereby standardized ones of the respective memory mats can be used and design management of the RAM module can be simplified.

We claim:

1. A semiconductor integrated circuit device comprising:
   a plurality of mats; and
   a control circuit which is commonly provided for said plurality of mats;
   said plurality of mats each including,
      a memory array;
      an arithmetic circuit which adds a predetermined value to an input address signal or subtracts the same therefrom to form an output address signal; and
      a comparator which determines coincidence or non-coincidence between either one of the input address signal or the output address signal and a mat selection signal commonly supplied to said plurality of mats; and
   wherein a plurality of said arithmetic circuits corresponding to said plurality of mats are connected in cascade form, and
   a corresponding memory array lying within a mat corresponding to said comparator having determined coincidence or non-coincidence is activated when the result of determination by said comparator shows a coincidence.

2. The semiconductor integrated circuit device according to claim 1, further comprising a common bit line which is commonly provided for said plurality of mats, and
   wherein said memory arrays each comprise,
      a plurality of word lines;
      a plurality of bit lines;
      a plurality of dynamic memory cells; and
      a switch circuit which is provided between said bit lines and said common bit line.

3. The semiconductor integrated circuit device according to claim 1, wherein the number of said mats selected at one time by said mat selection signal is changeable by said control circuit and the memory arrays lying within said selected mats are activated.

4. A semiconductor integrated circuit device comprising:
   a plurality of unit circuits respectively including,
      memory arrays;
      arithmetic circuits; and
      determination circuits, and
   wherein each arithmetic circuit adds a predetermined value to a signal inputted thereto or subtracts the same therefrom,
   said plurality of arithmetic circuits in said plurality of unit circuits are connected in cascade form such that signals outputted from said respective arithmetic circuits are set as input signals for the following-stage arithmetic circuits,
   said determination circuit determines coincidence or non-coincidence between either one of an input signal or an output signal of the corresponding arithmetic circuit and a selection signal commonly supplied to said plurality of unit circuits, and
   when the result of determination by said determination circuit shows a coincidence, the corresponding memory array lying within the unit circuit corresponding to said determination circuit having determined coincidence or non-coincidence is activated.

5. The semiconductor integrated circuit device according to claim 4, further comprising a circuit which compares the magnitudes of a numeric value indicated by an input signal or an output signal of the final-stage arithmetic circuit of said plurality of arithmetic circuits connected in the cascade form and a numeric value indicated by the selection signal.

6. The semiconductor integrated circuit device according to claim 4, wherein the number of unit circuits selected at one time by the selection signal is changeable and the memory arrays lying within said selected unit circuits are activated.

7. A semiconductor integrated circuit device comprising:
   a plurality of unit circuits each including,
      an internal circuit block;
      an arithmetic circuit; and
      a comparator; and
   wherein said each arithmetic circuit adds a predetermined value to a signal inputted thereto or subtracts the same therefrom,
   said plurality of arithmetic circuits in said plurality of unit circuits are connected in cascade form such that signals outputted from said respective arithmetic circuits are set as input signals for the following-stage arithmetic circuits, said comparator determines coincidence or non-coincidence between either one of an input signal or an output signal of the corresponding arithmetic circuit and a selection signal commonly supplied to said plurality of unit circuits, and when the result of determination by said comparator shows a coincidence, the corresponding internal circuit block lying within the unit circuit corresponding to said comparator having determined coincidence or non-coincidence is activated.

8. The semiconductor integrated circuit device according to claim 7, wherein said internal circuit block includes a memory cell array, and further including a digital processing circuit which performs arithmetic operations, based on data read from said memory cell array.

9. The semiconductor integrated circuit device according to claim 7, wherein said predetermined value is +1.

10. A semiconductor integrated circuit device comprising:
a RAM module including,
a plurality of memory mats each including a memory array; and
a control circuit commonly provided for said plurality of memory mats;
said memory array including a plurality of word lines, a plurality of bit lines and a plurality of memory cells,
said plurality of memory mats each including,
an arithmetic circuit which performs +1 or −1 arithmetic operations on each of address-setting input signals comprised of a plurality of bits; and
a comparator which determines whether an input signal supplied to said arithmetic circuit or a signal outputted from said arithmetic circuit coincides with an address signal inputted upon memory access, and
wherein said arithmetic circuits in said plurality of memory mats are connected in cascade form, and
each memory mat activates an address selecting operation according to a signal indicative of the coincidence.

11. The semiconductor integrated circuit device according to claim 10, wherein the number of said memory mats is set according to the storage capacity of said RAM module.

12. The semiconductor integrated circuit device according to claim 10 or 11, wherein said memory cells comprise dynamic memory cells, and
each memory array includes at least one sense amplifier which reads and amplifies information stored in the memory cell to be read into each bit line and restores the electrical charge stored in the memory cell to the original state, a precharge circuit which precharges the potential on said bit line, and a column switch which connects the bit lines to a global bit line commonly provided for said plurality of memory mats.

13. The semiconductor integrated circuit device according to claim 12, wherein each memory mat includes first and second determination circuits for respectively determining coincidences between binary information assigned to each memory mat and bank address information commonly inputted to said plurality of memory mats, and validates X-system address signals used for a selecting operation of each word line or a result of decoding thereof, based on the result of determination by said first determination circuit, and validates Y-system address signals used for a selecting operation of each bit line or a result of decoding thereof, based on the result of determination by said second determination circuit, and
said control circuit supplies a bank setting signal for allowing said first determination circuit to forcefully make a coincidence decision according to the number of memory mats to be activated.

14. The semiconductor integrated circuit device according to claim 13, wherein an X-system address selection circuit for selecting each word line comprises,
a predecode circuit which divides X-system address signals into plural pairs and predecodes the divided plural pairs;
an AND-configured row decoder which includes series-connected MOSFETs for receiving the predecode signals outputted from said predecode circuit; and
a word driver which selects the corresponding word line in response to a word line selection signal formed by said row decoder, and
wherein the operation of said predecode circuit or row decoder is controlled based on the result of determination formed by said first determination circuit so that the corresponding word line selecting operation is performed by a selected memory mat.

15. The semiconductor integrated circuit device according to claim 10, further comprising an overflow check circuit which compares the magnitudes of an input signal supplied to the final-stage arithmetic circuit of said plurality of arithmetic circuits connected in cascade form or an output signal produced therefrom and each address signal inputted upon memory access of each memory mat, and
wherein the operation of a read amplifier for amplifying a read signal outputted from said memory mat is forcefully stopped according to an overflow detection signal detected by said overflow check circuit, and the overflow detection signal is transmitted to the outside of said RAM module.

16. The semiconductor integrated circuit device according to claim 11, wherein said control circuit further includes a detector which receives therein a signal outputted from the final-stage arithmetic circuit of said plurality of arithmetic circuits connected in cascade form and detects the number of mounted memory mats, and
said control circuit adjusts the load on each driver, which forms a control signal or a timing signal commonly supplied to said memory mats, so as to become substantially constant regardless of the number of the memory mats.

17. The semiconductor integrated circuit device according to claim 16, wherein each memory mat further includes dummy load circuits provided in a path for transmitting the control signal or the timing signal,
said control circuit designates the number of the dummy load circuits mounted to said respective memory mats, which are connected to said respective memory mats, and
said each memory mat is selectively connected to the corresponding dummy loads according to the control signal specified by said control circuit and the whole load on the driver is adjusted so as to become substantially constant regardless of the number of the memory mats.

18. The semiconductor integrated circuit device according to claim 16, wherein said control circuit further includes dummy load circuits provided at an output portion of a path for transmitting the control signal or the timing signal, and
said control circuit controls the number of the dummy load circuits connected to said respective memory mats so that the sum of the numbers of the mounted memory mats becomes equivalently identical to the maximum number of mounted memory mats, and controls the whole load on the driver for forming the control signal or timing signal so as to become substantially constant regardless of the number of the memory mats.

19. The semiconductor integrated circuit device according to claim 15, wherein said RAM module includes a control circuit and a plurality of memory mats arranged side by side in a straight line, said arithmetic circuit in the memory mat provided at a position farthest from the control circuit is placed so as to be an initial-stage circuit and the arithmetic circuit in the memory mat disposed adjacent to the control circuit is placed so as to be a final-stage circuit, and the overflow check circuit is provided in the control circuit or on the control circuit side, and a read amplifier for amplifying a read signal from each memory mat and a circuit for transmitting an overflow detection signal therefrom are placed in the control circuit.

20. The semiconductor integrated circuit device according to claim 16, wherein said RAM module includes a control circuit and a plurality of memory mats arranged side by side in a straight line, said arithmetic circuit in the memory mat provided at a position farthest from the control circuit is placed so as to be an initial-stage circuit and said arithmetic circuit in the memory mat disposed adjacent to the control circuit is placed so as to be a final-stage circuit, and the number-of-memory mats detector provided in the control circuit is supplied with a signal outputted from the final-stage arithmetic circuit.

21. The semiconductor integrated circuit device according to claim 10, wherein said control circuit is supplied with row-system and column-system address signals separately, and control circuit allows said each memory mat to perform row-system and column-system selecting operations in accordance with the separately-input row-system and column-system address signals.

22. The semiconductor integrated circuit device according to claim 21, wherein said row-system and column-system address signals are synchronized with a clock signal supplied from the outside of the RAM module and are inputted together with control signals which provide instructions for the operations of row-system and column-system circuits, said address signals include address signals which select one or a plurality of memory mats, and said instructions for the operation of said row-system circuit include two types of a start of the row-system selecting operation and an operation end for providing instructions for a precharge operation after the completion of the row-system selecting operation.

23. The semiconductor integrated circuit device according to claim 22, wherein when the immediately preceding state of said row-system circuit is said row-system selecting operation, said row-system circuit completes the previous operation and performs a precharge operation, and thereafter automatically performs a row-system selecting operation corresponding to the input address signals, whereas when the immediately preceding state thereof is said operation end state, said row-system circuit performs a row-system selecting operation corresponding to the input address signals.

24. The semiconductor integrated circuit device according to claim 22, wherein said RAM module has a reset input terminal and forcefully terminates the row-system and column-system selecting operations when a predetermined reset signal is inputted to said reset input terminal, whereby the selection circuit in each memory mat is brought to a precharge state.

25. The semiconductor integrated circuit device according to claim 12, wherein said RAM module is constructed such that in a state in which said semiconductor integrated circuit device is being supplied with a source voltage, the operation of each circuit is provided with the function of bringing it to a full standby state in which a current non-flowing state is held over a long time exceeding at least an information holding time of said each memory cell.

26. A semiconductor integrated circuit device comprising:

a plurality of circuit blocks each having a specific circuit function, said respective circuit blocks including, arithmetic circuits which are respectively provided in said respective circuit blocks and perform +1 or −1 arithmetic operations on address-setting input signals comprised of a plurality of bits; and comparators which respectively determine coincidences between input signals supplied to said arithmetic circuits or output signals produced therefrom and address signals, and wherein the arithmetic circuits in said plurality of circuit blocks are connected in cascade form, the arithmetic circuit in the initial-stage circuit block has an input terminal supplied with fixed address signals, and the corresponding circuit block in respective circuit blocks is activated when a coincidence signal is outputted from said each comparator.

* * * * *